(12) United States Patent
Tomita

(10) Patent No.: US 8,492,271 B2
(45) Date of Patent: Jul. 23, 2013

(54) SEMICONDUCTOR DEVICE AND METHOD OF MANUFACTURING THE SAME

(75) Inventor: Kazuo Tomita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/396,389

(22) Filed: Feb. 14, 2012

(65) Prior Publication Data
US 2012/0248609 A1 Oct. 4, 2012

(30) Foreign Application Priority Data

Mar. 29, 2011 (JP) ................................. 2011-071346

(51) Int. Cl.
*H01L 21/4763* (2006.01)
(52) U.S. Cl.
USPC ........... 438/637; 438/622; 438/627; 438/638; 438/639; 438/640; 257/751; 257/758
(58) Field of Classification Search
USPC .................. 438/637–640, 622, 627; 257/751, 257/758, E21.577, E23.161
See application file for complete search history.

(56) References Cited

U.S. PATENT DOCUMENTS

| 6,114,767 A * | 9/2000 | Nagai et al. | 257/758 |
| 7,354,859 B2 | 4/2008 | Nagase | |
| 2004/0084778 A1 * | 5/2004 | Hosoda et al. | 257/758 |
| 2011/0266679 A1 * | 11/2011 | Hotta et al. | 257/758 |

FOREIGN PATENT DOCUMENTS

| JP | 2002-319617 | 10/2002 |
| JP | 2006-245236 | 9/2006 |
| JP | 2006-294771 | 10/2006 |

* cited by examiner

*Primary Examiner* — Theresa T Doan
(74) *Attorney, Agent, or Firm* — McDermott Will & Emery LLP

(57) ABSTRACT

An object of the invention is to fully fill a wiring material in via holes formed in a low-hardness interlayer insulating film and a high-hardness interlayer insulating film, respectively, upon forming a Cu wiring in interlayer insulating films by using the dual damascene process. According to the invention, a second interlayer insulating film has therein both a wiring trench and a via hole. The via hole has, at the opening portion thereof, a recess portion having a tapered cross-sectional shape. It is formed by causing the second interlayer insulating film to retreat obliquely downward. The diameter of the opening portion of the via hole therefore becomes greater than the diameter of a region below the opening portion and it becomes possible to fully fill a wiring material in the via hole even if the via hole has a fine diameter.

5 Claims, 29 Drawing Sheets

EDGE LOSS AMOUNT E (=D-C)

FIG. 40
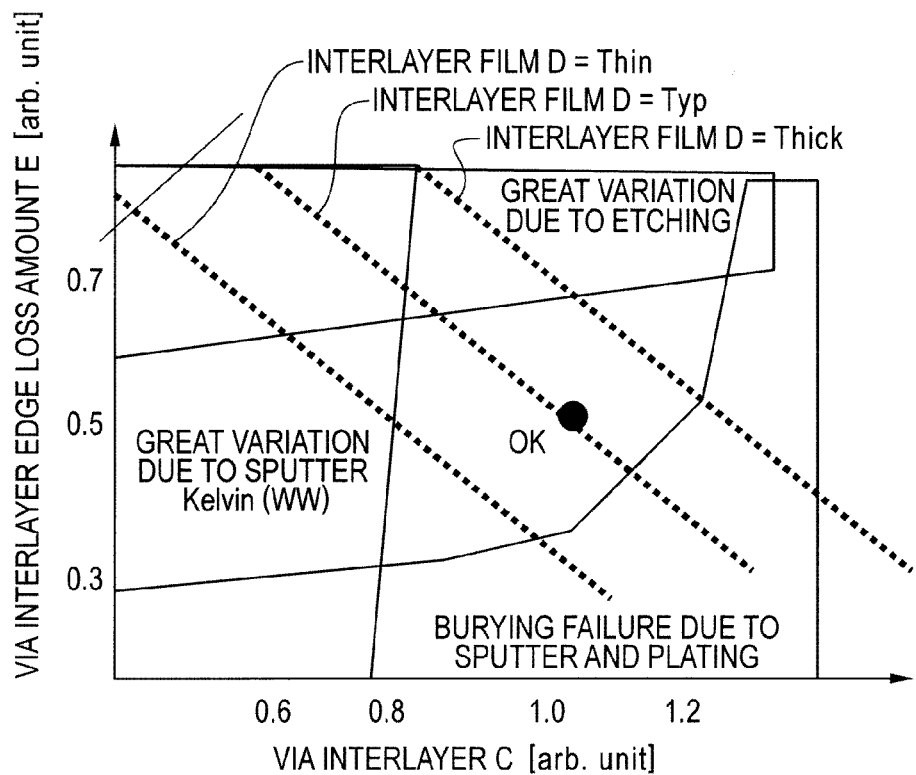
 GREAT VARIATION
GREAT EDGE LOSS
 Typ
 BURYING FAILURE
SMALL EDGE LOSS
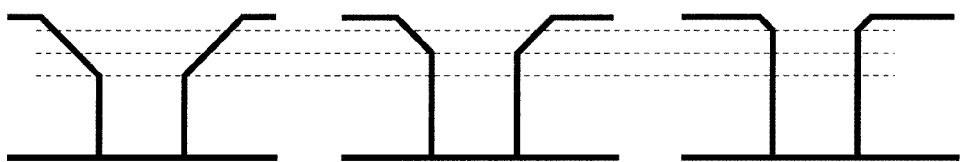

SEMICONDUCTOR DEVICE AND METHOD OF MANUFACTURING THE SAME

CROSS-REFERENCE TO RELATED APPLICATIONS

The disclosure of Japanese Patent Application No. 2011-71346 filed on Mar. 29, 2011 including the specification, drawings and abstract is incorporated herein by reference in its entirety.

BACKGROUND

The present invention relates to a semiconductor device and a manufacturing technology thereof, in particular, to a technology effective when applied to the manufacture of a semiconductor device using a dual damascene process for forming a fine Cu wiring in an interlayer insulating film on a semiconductor substrate.

With miniaturization and speed-up of LSI (large-scale integrated circuit), instead of conventionally used Al (aluminum), Cu (copper) having less electrical resistance has come to be used frequently as a wiring material of LSI.

However, a reaction rate of Cu with a plasma ion is so low that a sufficient productivity cannot be achieved when Cu wirings are formed by etching. A damascene process has therefore been used in the formation step of Cu wirings. This is a technology of forming a wiring trench in an interlayer insulating film, depositing a Cu film on the interlayer insulating film and in the wiring trench, and then polishing/removing the Cu film on the interlayer insulating film by chemical mechanical polishing to form a Cu wiring in the wiring trench.

In addition, since Cu is likely to be diffused in the interlayer insulating film so that the Cu wiring formed in the wiring trench should be covered around with a diffusion preventive film (barrier film). As the barrier film for covering the upper surface of the Cu wiring, an insulating film-based barrier film (liner film) is typically used. This liner film is also used as a portion of the interlayer insulating film on the Cu wiring. On the other hand, as a barrier film for covering the side walls and the bottom surface of the wiring trench, a metal-based barrier film (barrier metal film) is used. The barrier metal is formed in the wiring trench of the interlayer insulating film so that it is used as a portion of the wiring material.

The damascene process includes a single damascene process of simply forming a Cu wiring in a wiring trench and a dual damascene process of forming a wiring trench and a via hole in an interlayer insulating film successively and then burying a Cu film in the wiring trench and the via hole concurrently. Of these, the dual damascene process can simplify a formation step of Cu wirings so that it has been used frequently in a manufacturing step of a semiconductor device having a multilayer Cu wiring.

Description on the Cu wiring formation technology using the above-described dual damascene process can be found in Patent Documents 1 to 3.

The dual damascene process described in Patent Document 1 (Japanese Patent Laid-Open No. 2006-245236) includes the steps of: forming, on an insulating layer formed on a semiconductor substrate, a first film to be etched; forming a first mask film having an opening on the first film to be etched; forming, on the first mask film, a second film to be etched so as to fill the opening portion therewith; forming a second mask film on the second film to be etched; forming a wiring pattern in the second mask film located above the opening portion; with the second mask film as a mask, etching the second film to be etched to form a wiring pattern from the bottom of which the first mask film is exposed and, with the first mask film exposed from the bottom of the wiring pattern as a mask, etching the first film to be etched to form a via pattern in the first film to be etched; and selectively etching the insulating layer by using the wiring pattern and the via pattern to form a via hole in the insulating layer and at the same time, form a wiring trench above the via hole.

According to this document, the first and second films to be etched are removed selectively by the same etching step with the first and second mask films as masks and the wiring pattern and the via pattern are formed on the insulating layer simultaneously with high precision so that this process can form a dual damascene structure having a fine wiring structure with high precision.

The dual damascene process described in Patent Document 2 (Japanese Patent Laid-Open No. 2006-294771) is characterized by that it is equipped with a step of forming, on an insulating film, a first mask so as to have a wiring trench pattern, a step of forming, on the first mask, a second mask so as to have a connection hole pattern, and a step of forming a wiring trench and a connection hole in the insulating film with the first mask and the second mask; in the step of forming a wiring trench and a connection hole in the insulating film with the first mask and the second mask, the connection hole is formed first in the insulating film; and the connection hole pattern is formed in a direction intersecting the arrangement direction of the wiring trench pattern and at the same time, the end portion of the connection hole pattern is formed on a portion of the first mask.

According to this process, a margin of the connection hole pattern in lithography is secured and the first mask having a wiring trench pattern formed therein determines the position of the arranging direction of the wiring trench in self alignment so that misalignment does not occur and connection hole patterns can be formed densely in the arrangement direction of wiring trenches.

Patent Document 3 (Japanese Patent Laid-Open No. 2002-319617) discloses a technology of, in forming a wiring trench and a via hole in an interlayer insulating film covering the upper portion of a first wiring layer therewith, etching an upper portion of the via hole reaching the bottom of the wiring trench into a tapered shape in order to suppress it from overhanging during embedding a second wiring layer and thus, preventing formation of voids.

Patent Document 1: Japanese Patent Laid-Open No. 2006-245236
Patent Document 2: Japanese Patent Laid-Open No. 2006-294771
Patent Document 3: Japanese Patent Laid-Open No. 2002-319617

SUMMARY

When Cu wirings formed by the above dual damascene process become smaller and the width of wiring trenches or diameter of via holes formed in an interlayer insulating film decreases to a size comparable to the minimum processing size of a circuit, an aspect ratio of via holes placed at the bottom of the wiring trenches becomes greater particularly, which makes it difficult to fully fill a wiring material (barrier metal film, Cu film) in the via holes.

In order to reduce the parasitic capacitance of wirings formed in a wiring trench, a porous insulating film called "extremely low dielectric constant film" or "ultra low dielectric constant film" has been used recently as an interlayer insulating film material of lower layers in which wiring trenches are formed with a higher density. The porous insulating film however cannot be processed easily because it has lower hardness than that of typical insulating films.

In an MHM (metal hard mask) process in which wiring trenches are formed in an insulating film by etching with a metal film as a mask, when misalignment occurs between a mask pattern for forming wiring trenches and a mask pattern for forming via holes, the diameter of the via holes drops below the minimum processing size of a circuit. This makes it further difficult to fill a wiring material in them.

As a result, problems such as increase or variation in resistance of Cu wirings inside the via holes occur prominently. In addition, in Cu wirings which are coupled to these Cu wirings and located thereon, electro migration or stress migration occurs, leading to a significant decrease in wiring life.

An object of the invention is to provide, in a semiconductor device having Cu wirings in interlayer insulating films of a plurality of layers by using a dual damascene process, a technology capable of fully filling a wiring material in via holes formed in an interlayer insulating film having a low-hardness layer therebelow and an interlayer insulating film having a high-hardness layer thereon.

Another object of the invention is to provide, in a semiconductor device having Cu wirings in an interlayer insulating film of a plurality of layers by using a dual damascene process, a technology capable of fully filling a wiring material in a plurality of via holes formed in the same interlayer insulating film but different in diameter.

The above-described and other objects and novel features of the invention will be apparent from the description herein and accompanying drawings.

Of the inventions disclosed herein, typical ones will next be outlined simply.

A method of manufacturing a semiconductor device according to one preferred embodiment of the invention includes steps of: (a) successively forming a first etching stopper film and a first interlayer insulating film over the main surface of a semiconductor substrate and forming a first metal hard mask layer containing a metal element over the first interlayer insulating film, (b) etching the first metal hard mask layer with a first photoresist film as a mask to form a plurality of first wiring trench patterns in the first metal hard mask layer, (c) after removal of the first photoresist film, forming a second photoresist film over the first metal hard mask layer having the first wiring trench patterns formed therein, (d) etching the first interlayer insulating film with the second photoresist film having a plurality of first via holes patterned therein and the first metal hard mask layer as a mask to form the first via holes in the first interlayer insulating film, (e) after removal of the second photoresist film, etching the first interlayer insulating film with the first metal hard mask layer as a mask to form, in the first interlayer insulating film, a plurality of first wiring trenches having a thickness smaller than the thickness of the first interlayer insulating film, (f) during or after the step (e), removing the first etching stopper film exposed from the bottom surface of each of the first via holes; (g) after the step (f), successively depositing a first barrier metal film and a first metal film having Cu as a main component thereof over the first metal hard mask layer, in each of the first wiring trenches, and in each of the first via holes, (h) polishing and removing the first metal film, the first barrier metal film, and the first metal hard mask layer over the first interlayer insulating film by chemical mechanical polishing to form a first-level wiring comprised of the first metal film and the first barrier metal film in each of the first wiring trenches and each of the first via holes, (i) successively forming a second etching stopper film and a second interlayer insulating film over the first interlayer insulating film and the first-level wiring, (j) etching the second interlayer insulating film with a third photoresist mask having a plurality of second via holes patterned therein as a mask to form the second via holes in the second interlayer insulating film, (k) after removal of the third photoresist film, forming a fourth photoresist film over the second interlayer insulating film, (l) etching the second interlayer insulating film with the fourth photoresist film having a plurality of second wiring trenches patterned therein as a mask to form, in the second interlayer insulating film, the second wiring trenches having a depth smaller than the thickness of the second interlayer insulating film, (m) after removal of the fourth photoresist film, removing the second etching stopper film exposed from the bottom surface of each of the second via holes, (n) after the step (m), depositing a second barrier metal film comprised of a metal nitride film over the second interlayer insulating film, and in each of the second wiring trenches and in each of the second via holes, (o) removing the second barrier metal film on the bottom surface of each of the second via holes and exposing the first-level wiring on the bottom surface of each of the second via holes, (p) after the step (o), successively depositing a third barrier metal film comprised of a metal film and a second metal film having Cu as a main component thereof over the second interlayer insulating film, and in each of the second wiring trenches, and in each of the second via holes, and (q) polishing and removing the second metal film, the third barrier metal film, and the second barrier metal film over the second interlayer insulating film by using chemical mechanical polishing to form a second-level wiring including the second metal film and the third barrier metal film in each of the second wiring trenches and each of the second via holes. In the step (f), by recessing the first interlayer insulating film at the opening portion of each of the first via holes, the diameter of the opening portion of each of the first via holes is made greater than the diameter of a region below the opening portion. In the step (m), by recessing the second interlayer insulating film at the opening portion of each of the second via holes, the diameter of the opening portion of each of the second via holes is made greater than the diameter of a region below the opening portion. In the step (o), by sputter etching the second barrier metal film and the second interlayer insulating film at the opening portion of each of the second via holes, the diameter of the opening portion of each of the second via holes is made further greater than the diameter of a region below the opening portion.

A semiconductor device according to one preferred embodiment of the invention has a first insulating film formed over the main surface of a semiconductor substrate, a first copper wiring formed in the first insulating film, a second insulating film formed over the first insulating film and the first copper wiring, a first via hole placed in the second insulating film, a second via hole placed in the second insulating film, a first trench placed in the second insulating film to be continuous to the upper portion of the first via hole, a second trench placed in the second insulating film to be continuous to the upper portion of the second via hole, a second copper wiring obtained by filling copper in the first via hole and the first trench, and a third copper wiring obtained by filling copper in the second via hole and the first trench. The first via hole has, on the upper portion thereof, a first recess portion having a first depth and the second via hole has, on the upper portion thereof, a second recess portion having a depth smaller than the first depth. When viewed cross-sectionally, the diameter of the second via hole is greater than the diameter of the upper portion of the first via hole.

Advantages available from typical inventions, among the inventions disclosed herein, will next be described briefly.

According to the above-described one embodiment, when via holes are formed for filling a wiring material in each of an interlayer insulating film having a low-hardness layer therebelow and an interlayer insulating film having a high-hardness layer thereover, a recess portion having a desired retreat amount can be formed at the opening portion of each of the via holes.

This makes it possible to fully fill the wiring material in the via holes formed in the interlayer insulating film of a plurality of layers, thereby manufacturing a multilayer wiring semiconductor device having improved reliability and production yield.

BRIEF DESCRIPTION OF THE DRAWINGS

FIG. 40 is a graph showing the relationship between the depth of a via hole and an edge loss amount found by the present inventors.

DETAILED DESCRIPTION

Figure 1:
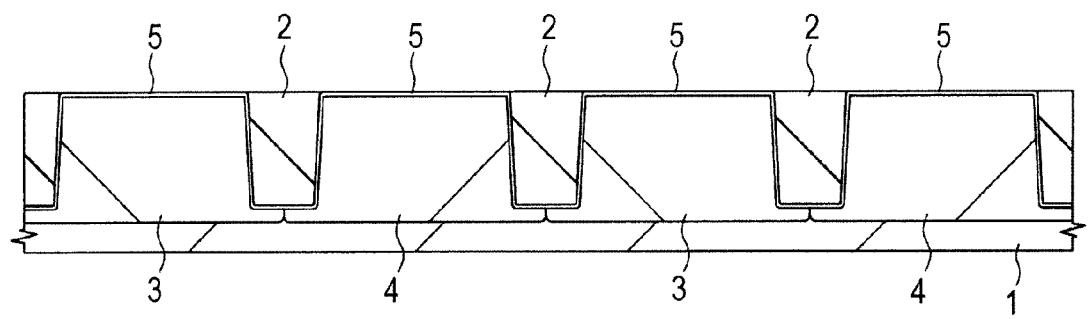
FIG. 1 is a cross-sectional view showing a manufacturing method of a semiconductor device according to First Embodiment of the invention.

Embodiments of the invention will next be described in detail referring to drawings. In all the drawings for describing the embodiments, members of a like function will be identified by like reference numerals and overlapping descriptions will be omitted. In the following embodiments, descriptions on the same portions or similar portions will not be repeated in principle unless otherwise particularly necessary. Further, to facilitate understanding the structure in the drawings for describing the embodiments, hatching is sometimes given even to a plan view or hatching is sometimes omitted from even a cross-sectional view.

Figure 39:
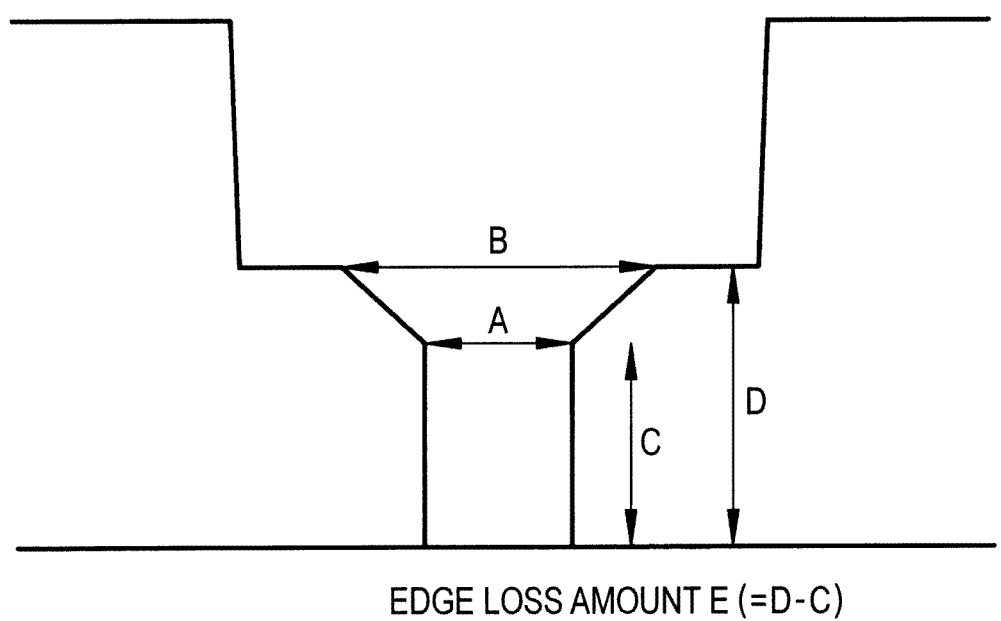
FIG. 39 is a view schematically showing the cross-sectional shape of a wiring trench and a via hole therebelow formed in an interlayer insulating film.

The invention has been made based on the following finding obtained by the present inventors for the first time, which will be described referring to FIGS. 39 and 40. FIG. 39 is a view schematically showing the cross-sectional shape of a wiring trench and a via hole therebelow formed in an interlayer insulating film. In this drawing, denoted by A, B, C, and D are a diameter of the opening portion of the via hole, a diameter of a recess portion formed by the obliquely downward retreat of the interlayer insulating film at the opening portion of the via hole when the via hole is formed by etching the interlayer insulating film, a depth of the via hole except for the recess portion, and a depth of the via hole including the recess portion, respectively. The term "edge loss portion" denoted by E means a difference in the depths D and C, that is, a vertical component of the retreat amount of the interlayer insulating film at the recess portion.

It has conventionally been thought that the edge loss amount (E) of an interlayer insulating film as shown in FIG. 39 is more advantageous for filling wiring materials (a Cu film and a barrier metal film) when it is greater so that the edge loss amount (E) should be made greater in order to improve the coverage with a barrier metal film.

As shown in the graph of FIG. 40, however, it has been found by the present inventors that when the edge loss amount (E) becomes excessively great, the resistance of the wiring materials to be filled in the via hole vary greatly.

The reason for it will next be described. When the edge loss amount (E) becomes excessively great, the thickness of a high-resistance barrier metal film deposited on the bottom of the via hole becomes greater than that of the Cu film deposited thereon and moreover, when the edge loss amount (E) is increased, the size of the edge loss itself varies greatly among many via holes. As a result, an uneven barrier metal is deposited on the bottom of the via holes, some via holes have an increased resistance, and the resistance varies greatly among a plurality of via holes. A standardized resistance is plotted along the abscissa of the graph of FIG. 40 and a cumulative probability when many via holes are formed is plotted along the ordinate.

It has also been found by the present inventors that when an edge loss ratio (C/D) is excessively large or when a ratio (B/A) between the upper portion and the lower portion of the recess portion is excessively large, the same problem as that caused by an excessively large edge loss amount (E) occurs.

Embodiment 1

This embodiment is applied to a semiconductor device having multilayer Cu wiring and a manufacturing method of it will next be described in order of steps referring to the accompanying drawings.

First, as shown in FIG. 1, after formation of an element isolation trench 2, an n well 3, and a p well 4 in the main surface of a semiconductor substrate 1 made of single crystal silicon, a gate insulating film 5 made of silicon oxide is formed on the surface of each of the n well 3 and the p well 4. The element isolation trench 2 is formed by filling a silicon oxide film in a trench formed in the main surface of the semiconductor substrate 1 in accordance with STI (shallow trench isolation), while the n well 3 and the p well 4 are formed by ion implantation of impurities. The gate insulating film 5 is formed by thermal oxidation of the surface of each of the n well 3 and the p well 4.

Figure 2:
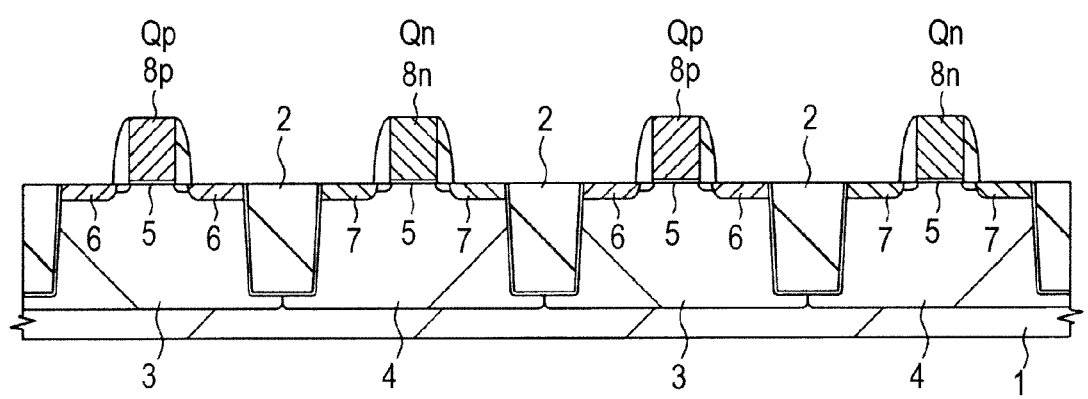
FIG. 2 is a cross-sectional view showing the manufacturing method of a semiconductor device following FIG. 1.

Next, as shown in FIG. 2, a p channel MISFET (Qp) is formed in the n well 3 and an n channel MISFET (Qn) is formed in the p well 4. In this drawing, denoted by reference numeral 6 is a p type semiconductor region constituting a source and a drain of the p channel MISFET (Qp) and denoted by reference numeral 7 is an n type semiconductor region constituting a source and a drain of the n channel MISFET (Qn). Denoted by reference numeral 8p is a gate electrode of the p channel MISFET (Qp), while denoted by reference numeral 8n is a gate electrode of the n channel MISFET (Qn). The gate electrode 8p is comprised of a polycrystalline silicon film doped with, for example, p type impurities and the gate electrode 8n is comprised of a polycrystalline silicon film doped with, for example, n type impurities.

Figure 3:
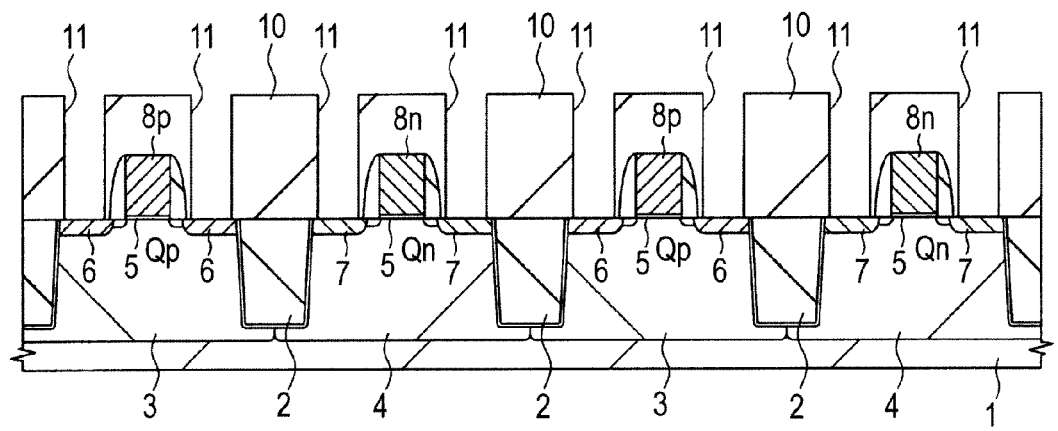
FIG. 3 is a cross-sectional view showing the manufacturing method of a semiconductor device following FIG. 2.

Next, as shown in FIG. 3, after formation of an insulating film 10 over the p channel MISFET (Qp) and the n channel MISFET (Qn), the surface of the insulating film 10 is planarized by chemical mechanical polishing. Then, with a photoresist film as a mask, the insulating film 10 is dry etched to form contact holes 11 over the source and drain (p type semiconductor regions 6) of the p channel MISFET (Qp) and over the source and drain (the n type semiconductor regions 7) of the n channel MISFET (Qn). The diameter of each of the contact holes 11 is equal to the minimum processing size of a circuit in the insulating layer (insulating film 10) in which the contact holes 11 are provided and it is, for example, 70 nm here.

The above-described insulating film 10 is comprised of, for example, a USG (undoped silicate glass) oxide film deposited using plasma CVD and it has a film thickness, after planarization, of about 400 nm. The insulating film 10 can be comprised of a silicon oxide-based insulating film other than the USG oxide film, for example, a TEOS (tetra ethyl ortho silicate) film deposited by thermal CVD or plasma CVD.

Figure 4:
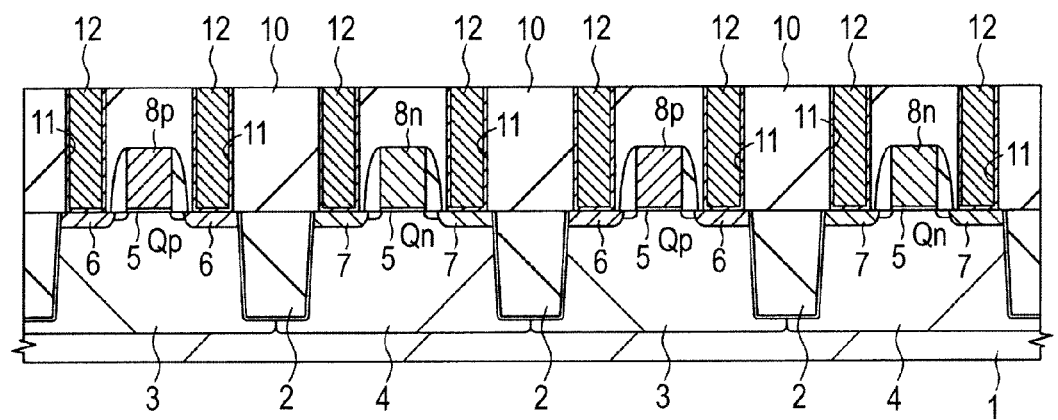
FIG. 4 is a cross-sectional view showing the manufacturing method of a semiconductor device following FIG. 3.

Next, as shown in FIG. 4, a metal plug 12 is filled in the contact holes 11 formed in the insulating film 10. The metal plug 12 is comprised of a film stack of a barrier metal film deposited by sputtering and a W (tungsten) film filled inside of the barrier metal film. The barrier metal film here is comprised of, for example, a film stack of a Ti (titanium) film of 5 nm thick and a TiN (titanium nitride) film of 5 nm thick formed on this Ti film or a film stack of a Ta (tantalum) film of 5 nm thick and a TaN (tantalum nitride) film of 5 nm thick formed on this Ta film. The thickness of the W film is, for example, 200 nm.

The metal plug 12 is filled in each of the contact holes 11, for example, by depositing the barrier metal film on the insulating film 10 and in the contact hole 11 by using sputtering or CVD, depositing the W film by using CVD, and then polishing and removing the barrier metal film and the W film on the insulating film 10 by chemical mechanical polishing.

Figure 5:
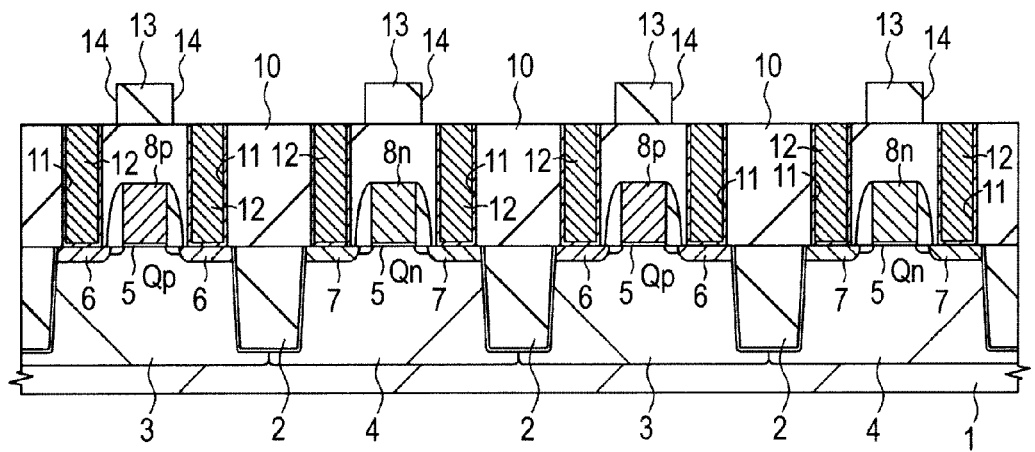
FIG. 5 is a cross-sectional view showing the manufacturing method of a semiconductor device following FIG. 4.

Next, as shown in FIG. 5, after deposition of a first interlayer insulating film 13 of 150 nm thick on the insulating film 10, wiring trenches 14 are formed in the first interlayer insulating film 13 on the contact holes 11. The first interlayer insulating film 13 is comprised of an insulating film having a dielectric constant less than 2.5 in order to reduce the parasitic capacitance of wirings formed in the wiring trenches 14 in the next step. Such an insulating film is called an extremely low dielectric constant (ELK: extremely low-k) film or an ultra low dielectric constant (ULK: ultra low-k) film. Examples of the extremely low dielectric constant film include a porous SiOC film, a porous HSQ (hydrogen silsesquioxane) film, and a porous MSQ (methyl silsesquioxane) film, each deposited by CVD or the method of application.

The above-described porous SiOC film, porous HSQ film, or porous MSQ film is formed by depositing film components including porogen by CVD or the method of application and then carrying out UV curing, plasma curing, heat treatment, or curing with electron beams to cause elimination of the porogen from the film components. Accordingly, the porous SiOC film, porous HSQ film or porous MSQ film has, in addition to a plurality of small-average-diameter voids which each film originally has, a plurality of large-average-diameter voids formed as a result of the elimination of the porogen.

Figure 6:
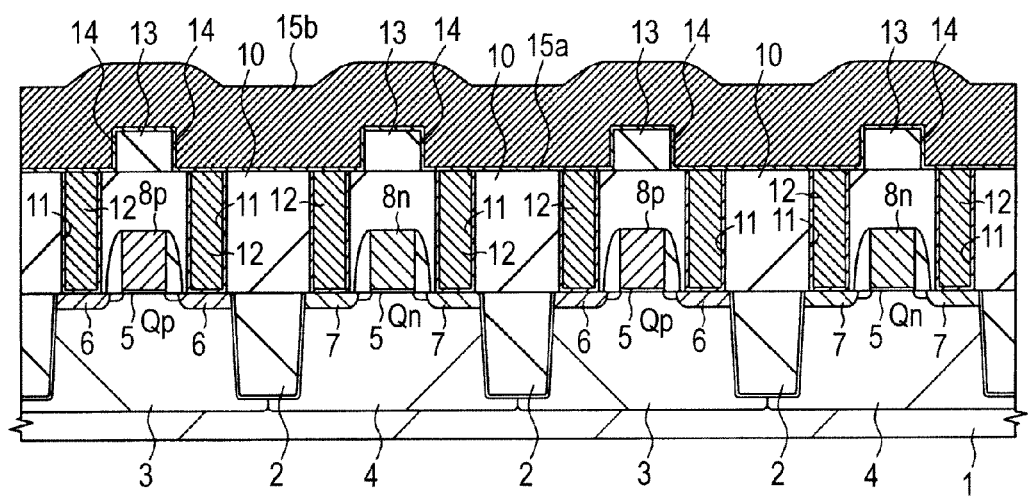
FIG. 6 is a cross-sectional view showing the manufacturing method of a semiconductor device following FIG. 5.

Next, as shown in FIG. 6, a barrier metal film 15a and a Cu film 15b are deposited on the first interlayer insulating film 13 and in the wiring trench 14. The barrier metal film 15a is comprised of, for example, a TaN film of 5 nm thick deposited by sputtering and a Ta film of 5 nm thick deposited over the TaN film by sputtering. The Cu film 15b is comprised of, for example, a Cu seed film of 50 nm thick deposited by sputtering and a Cu film of 500 nm thick deposited by electroplating. The Cu seed film is comprised of a Cu alloy obtained by adding, to the main component Cu, a trace element such as Al, Si, Ge, Ga, Sn, or Mn. By the heat treatment conducted after deposition of the Cu film 15b, the trace element in the Cu seed film is diffused to the Cu film deposited by electroplating and the Cu film becomes a Cu alloy film. The barrier metal film 15a is formed in order to prevent the Cu film 15b, which is a wiring material, from diffusing into the first interlayer insulating film 13 around the wiring trench 14.

Figure 7:
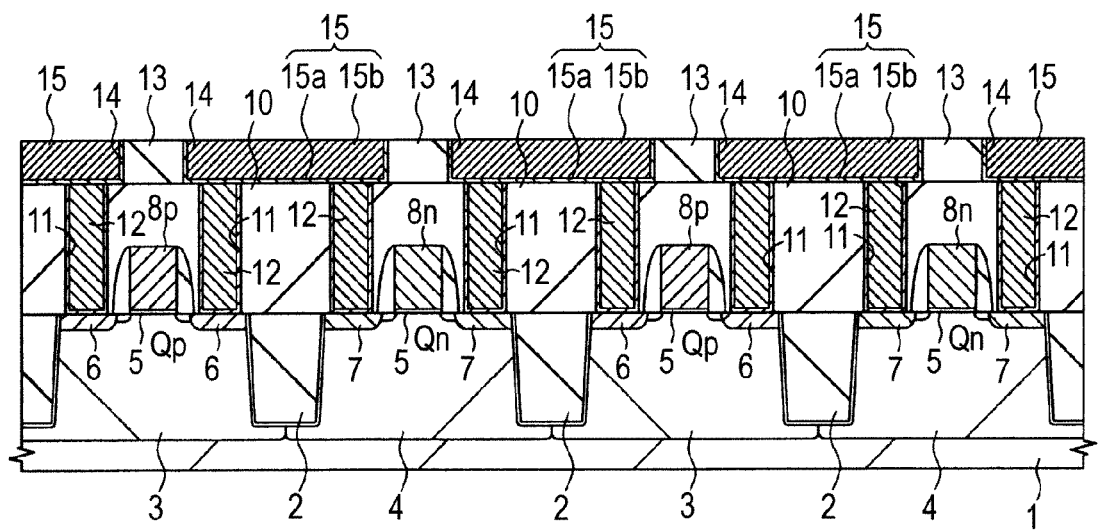
FIG. 7 is a cross-sectional view showing the manufacturing method of a semiconductor device following FIG. 6.

Next, as shown in FIG. 7, the Cu film 15b and the barrier metal film 15a on the first interlayer insulating film 13 are polished and removed by chemical mechanical polishing to form, in the wiring trenches 15, a plurality of first-level wirings 15 each comprised of the barrier metal film 15a and the Cu film 15b. These first-level wirings 15 are each electrically coupled to the source and drain (p type semiconductor regions 6) of the p channel MISFET (Qp) or the source and drain (n type semiconductor regions 7) of the n channel MISFET (Qn) via the metal plugs 12 in the contact holes 11 formed in the insulating film 10.

Figure 8:
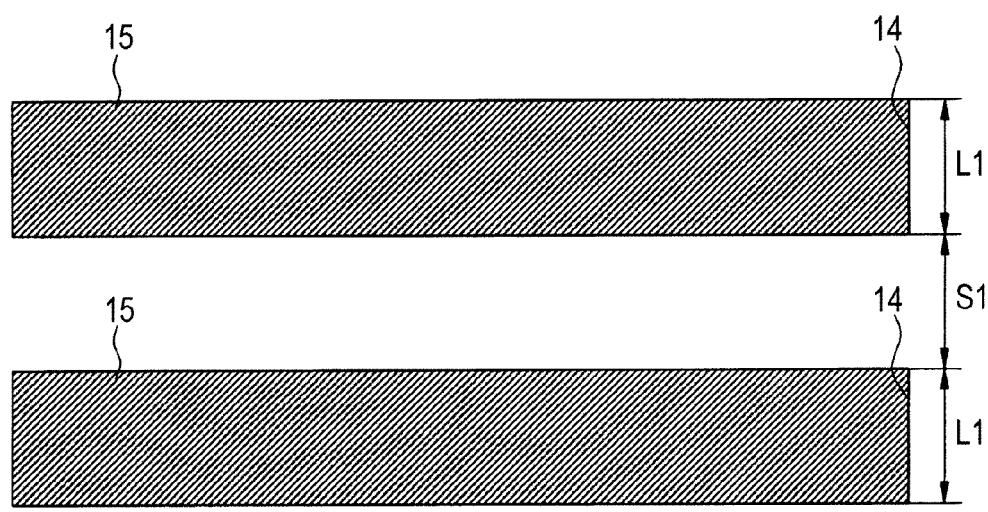
FIG. 8 is a plan view showing a portion of a first-level wiring formed in a wiring trench.

FIG. 8 is a plan view showing the first-level wiring 15 formed in the wiring trench 14. The line width (L1) of this first-level wiring 15 and the space (S1) between two first-level wirings 15 and 15 adjacent to each other are each equal to the minimum processing size (for example, 70 nm here) of a circuit in the wiring layer in which the first-level wiring 15 is formed.

Figure 9:
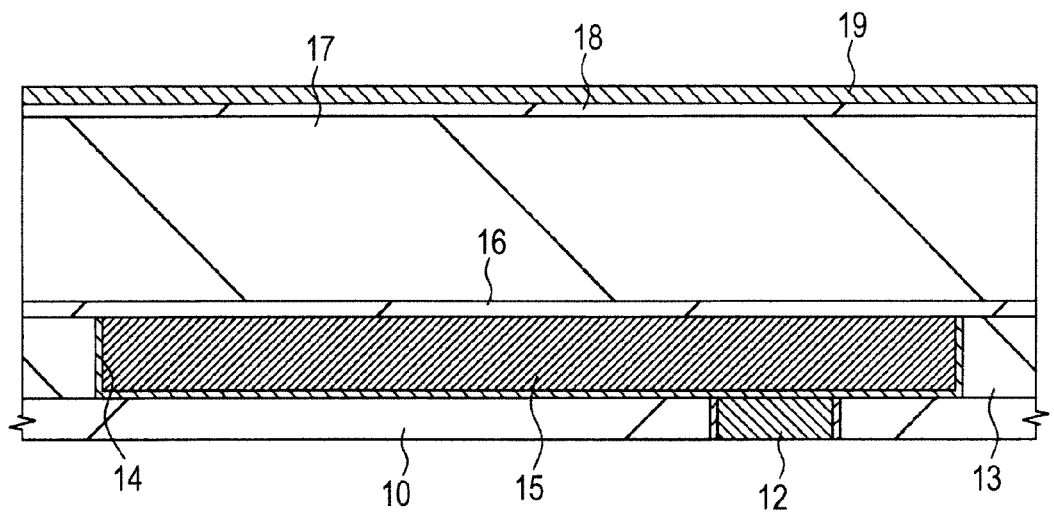
FIG. 9 is a cross-sectional view showing the manufacturing method of a semiconductor device following FIG. 7.

Next, as shown in FIG. 9, a liner film 16 of 40 nm thick, a second interlayer insulating film 17 of 230 nm thick, an insulating film 18 of 20 nm thick, and a metal hard mask layer 19 of 30 nm thick are deposited in the order of mention over the first interlayer insulating film 13 and the first-level wiring 15. It is to be noted that in FIG. 9 and drawings for describing the following steps, only the insulating film 10 and a region thereover are shown and a region below the insulating film 10, that is, the semiconductor substrate 1, the p channel MISFET (Qp), the n channel MISFET (Qn), and the like are omitted.

The liner film 16 is an insulating barrier film for preventing Cu, which is a main component of the first-level wiring 15, from diffusing into the second interlayer insulating film 17 and it is comprised of, for example, a SiC film (dielectric constant: about 4.8) deposited by CVD. This liner film 16 also functions as an etching stopper when a via hole is formed in the second interlayer insulating film 17 in a step described later. The liner film 16 may be comprised of an insulating film other than the SiC film, for example, a SiCN film or SiN film deposited by plasma CVD.

The second interlayer insulating film 17 on the liner film 16 is, similar to the first interlayer insulating film 13 lying therebelow, comprised of an extremely low dielectric constant film (ELK film) in order to reduce a parasitic capacitance of a second-level wiring which will be formed in the second interlayer insulating film 17 in a step described later. The insulating film 18 on the second interlayer insulating film 17 is comprised of an insulating material different in etch selectivity from the second interlayer insulating film (ELK film), for example, a TEOS film deposited by plasma CVD. The metal hard mask layer 19 on the insulating film 18 is comprised of, for example, a TiN film deposited by sputtering. The metal hard mask layer 19 is used as an etching mask when a wiring trench is formed in the second interlayer insulating film 17 in a step described later. Incidentally, the metal hard mask layer 19 may be comprised of a film of a metal such as Ta, Ti, Ru, Mn, or W or a nitride film or oxide film of such a metal.

Figure 10:
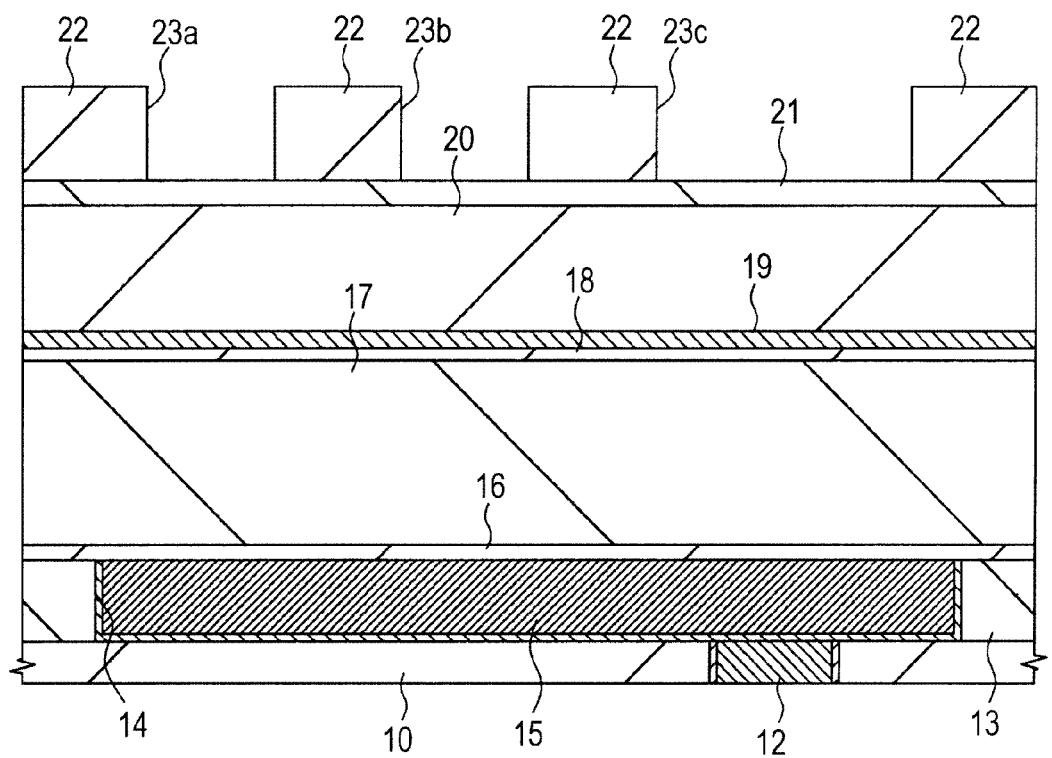
FIG. 10 is a cross-sectional view showing the manufacturing method of a semiconductor device following FIG. 9.

Next, as shown in FIG. 10, a lower-layer resist film 20 of 200 nm thick, an intermediate layer 21 of 50 nm thick, and an upper-layer resist film 22 of 150 nm thick are deposited in the order of mention on the metal hard mask layer 19. Then, the upper-layer resist film 22 is exposed and developed to transfer wiring trench patterns 23a, 23b, and 23c of a photomask (not illustrated) to the upper-layer resist film 22. The wiring trench patterns 23a, 23b, and 23c are mask patterns of wiring trenches formed in the second interlayer insulating film 17 in a step described later.

Figure 11:
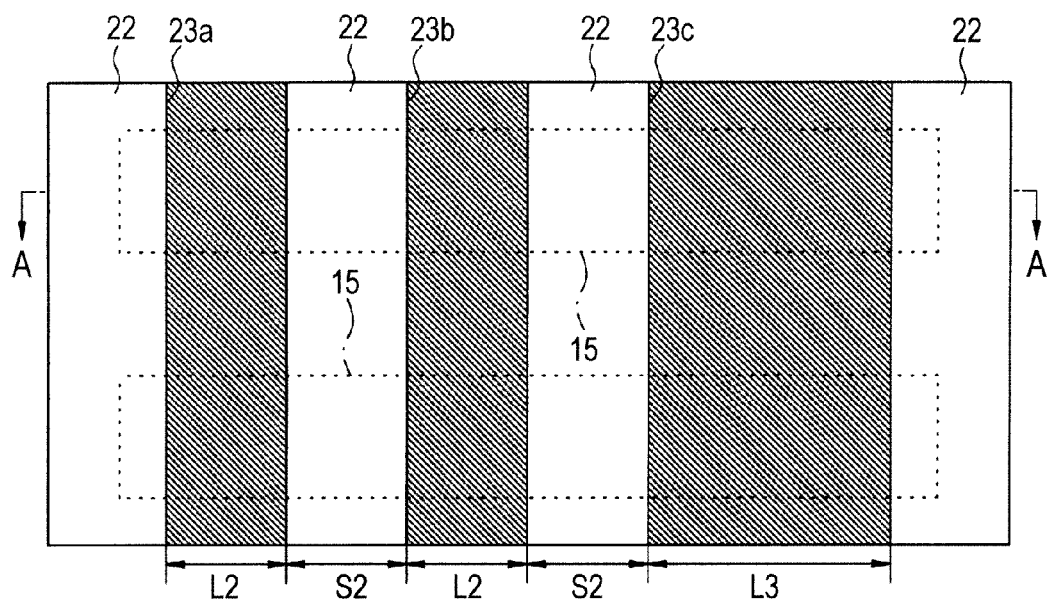
FIG. 11 is a plan view showing a planar shape of a wiring trench pattern transferred to an upper-layer resist film.

Hatched regions in FIG. 11 are planar shapes of the wiring trench patterns 23a, 23b, and 23c transferred to the upper-layer resist film 22. In FIG. 11, the planar shape of the first-level wiring 14 is shown with a dotted line. Incidentally, FIG. 10 is a cross-sectional view taken along the line A-A of FIG. 11.

As shown in FIG. 11, each of the wiring trench patterns 23a, 23b, and 23c transferred to the upper-layer resist film 22 extends in a direction perpendicular to the extending direction of the first-level wiring 15. The line width (L2) of each of the wiring trench patterns 23a and 23b and the space (S2) between any two of the wiring trench patterns 23a, 23b, and 23c adjacent to each other are each equal to the minimum processing size (=70 nm) of a circuit in the insulating layer in which the wiring trench patterns 23a, 23b, and 23c are formed. On the other hand, the line width (L3) of the wiring trench pattern 23c is greater than the minimum processing size of a circuit in the insulating layer in which the wiring trench patterns 23a, 23b, and 23c are formed and here it is, for example, 140 nm.

Figure 12:
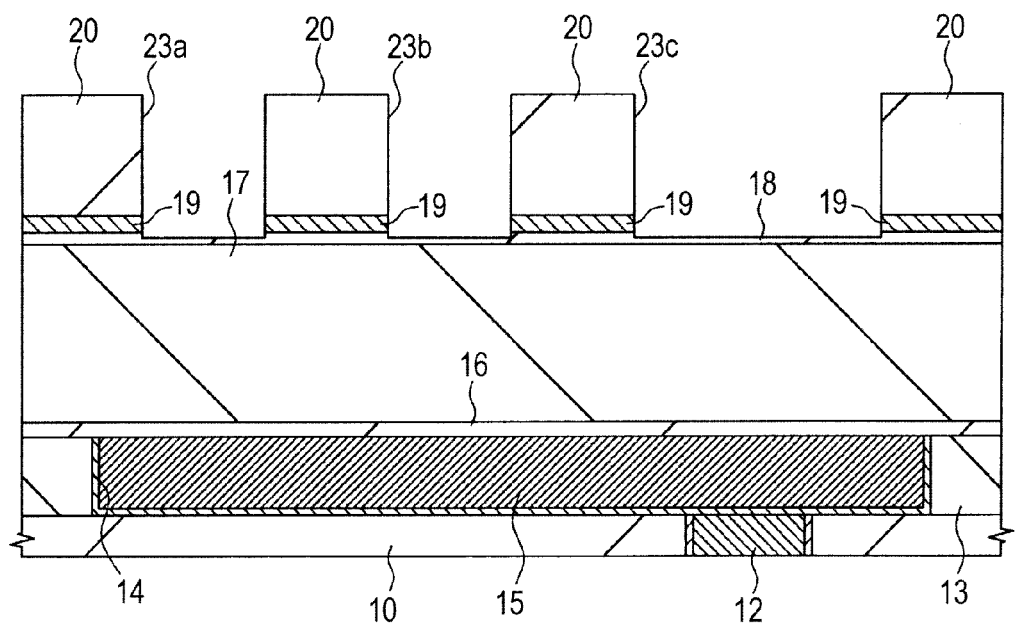
FIG. 12 is a cross-sectional view showing the manufacturing method of a semiconductor device following FIG. 10.

Next, as illustrated in FIG. 12, with the upper-layer resist film 22 as a mask, the intermediate layer 21 is dry etched. Then, with the upper-layer resist film 22 and the intermediate layer 21 as a mask, the lower-layer resist film 20 is dry etched, followed by dry etching of the metal hard mask layer 19 with the intermediate layer 21 and the lower-layer resist film 20 as a mask. As a result, the wiring trench patterns 23a, 23b, and 23c transferred to the upper-layer resist film 22 are transferred to the metal hard mask layer 19. Incidentally, the upper-layer resist film 22 disappears after dry etching of the lower-layer resist film 20 and the intermediate layer 21 disappears after dry etching of the metal hard mask layer 19.

Figure 13:
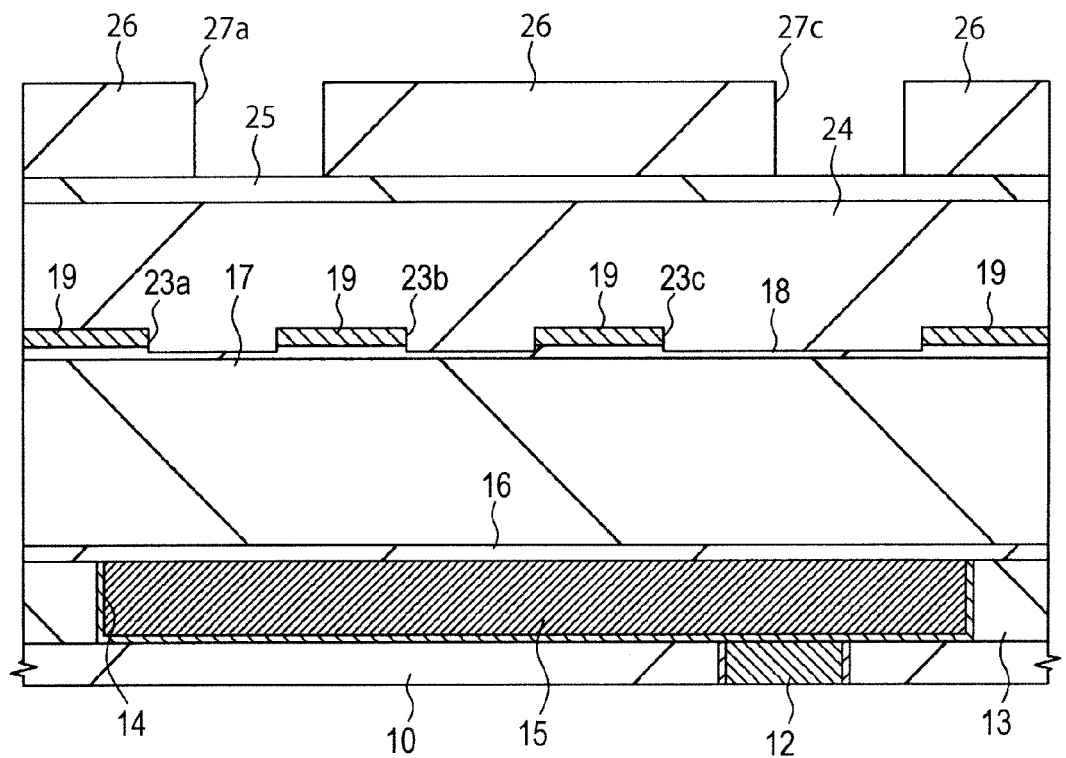
FIG. 13 is a cross-sectional view showing the manufacturing method of a semiconductor device following FIG. 12.

Next, after removal of the lower-layer resist film 20 by asking, a lower-layer resist film 24 of 200 nm thick, an intermediate layer 25 of 50 nm thick, and an upper-layer resist film 26 of 150 nm thick are deposited in the order of mention over the metal hard mask layer 19 as illustrated in FIG. 13. Then, the upper-layer resist film 26 is exposed and developed to transfer via hole patterns 27a, 27b, and 27c of a photomask (not illustrated) to the upper-layer resist film 26. The via hole patterns 27a, 27b, and 27c are mask patterns of via holes formed in the second interlayer insulating film 27 in a step described later. Diameters of them are equal to the minimum processing size (=70 nm) of a circuit in an insulating layer in which via hole patterns 28a, 28b, and 28c will be formed later.

Figure 14:
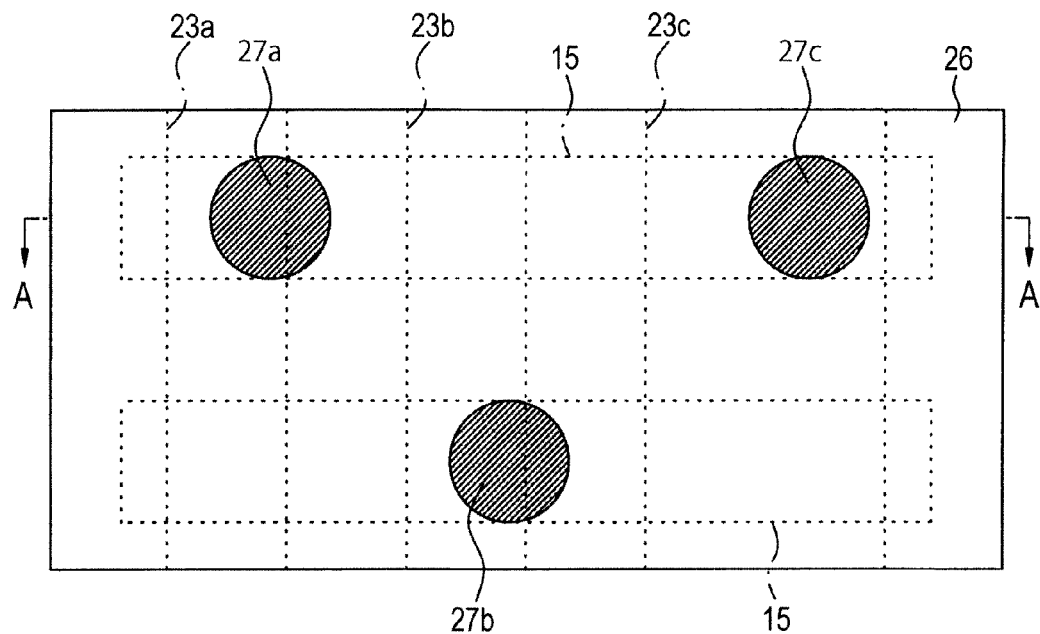
FIG. 14 is a plan view showing a planar shape of a via hole pattern transferred to an upper resist film.

Hatched circular regions of FIG. 14 show planar shapes of via hole patterns 27a, 27b, and 27c transferred to the upper-layer resist film 26. In FIG. 14, the planar shape of the first-level wiring 15 and the planar shapes of the wiring trench patterns 23a, 23b, and 23c are shown in a dotted line. Incidentally, FIG. 13 is a cross-sectional view taken along the line A-A of FIG. 14.

In practical manufacturing steps of a semiconductor device, there sometimes occurs misalignment between mask patterns of a via hole (via hole patterns 27a, 27b, and 27c) and mask patterns of a wiring trench (wiring trench patterns 23a, 23b, and 23c). For example, FIGS. 13 and 14 show examples of misalignment of mask patterns of a via hole (via hole patterns 27a, 27b, and 27c), relative to mask patterns of a wiring trench (wiring trench patterns 23a, 23b, 23c), in an extending direction (right direction in the drawing) of the first-level wiring 15.

When such misalignment occurs between mask patterns as described above, the via hole pattern 27a placed in a region where the first-level wiring 15 and the wiring trench pattern 23a intersect one another partially protrudes outside the wiring trench pattern 23a as shown in FIG. 14. Similarly, the via hole pattern 27b placed in a region where the first-level wiring 15 and the wiring trench pattern 23b intersect one another partially protrudes outside the wiring trench pattern 23b. On the other hand, the via hole pattern 27c placed in a region where the first-level wiring 15 and the wiring trench pattern 23c intersect one another does not protrude outside the wiring trench pattern 23c since its diameter is smaller than the line width of the wiring trench pattern 23c.

Figure 15:
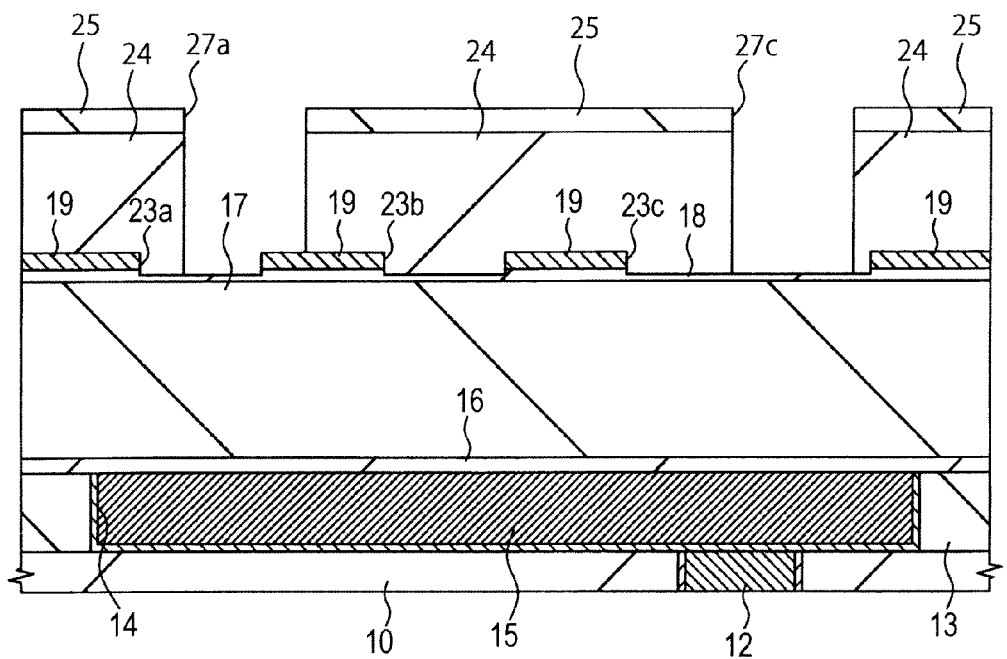
FIG. 15 is a cross-sectional view showing the manufacturing method of a semiconductor device following FIG. 13.

Then, as illustrated in FIG. 15, with the upper-layer resist film 26 as a mask, the intermediate layer 25 is dry etched, followed by dry etching the lower-layer resist film 24 with the upper-layer resist film 26 and the intermediate layer 25 as masks. During this dry etching, a portion of the metal hard mask layer 19 is exposed from the bottom surface of the via hole pattern 27a (and the via hole pattern 27b not shown in FIG. 15) due to misalignment between the above-described mask patterns. The metal hard mask layer 19 has a large etch selectivity ratio (for example, 20:1) with respect to the lower-layer resist film 24 so that the metal hard mask layer 19 exposed from the bottom surface of the via hole patterns 27a and 27b are hardly etched. Incidentally, the upper-layer resist film 26 disappears after dry etching of the lower-layer resist film 24.

Figure 16:
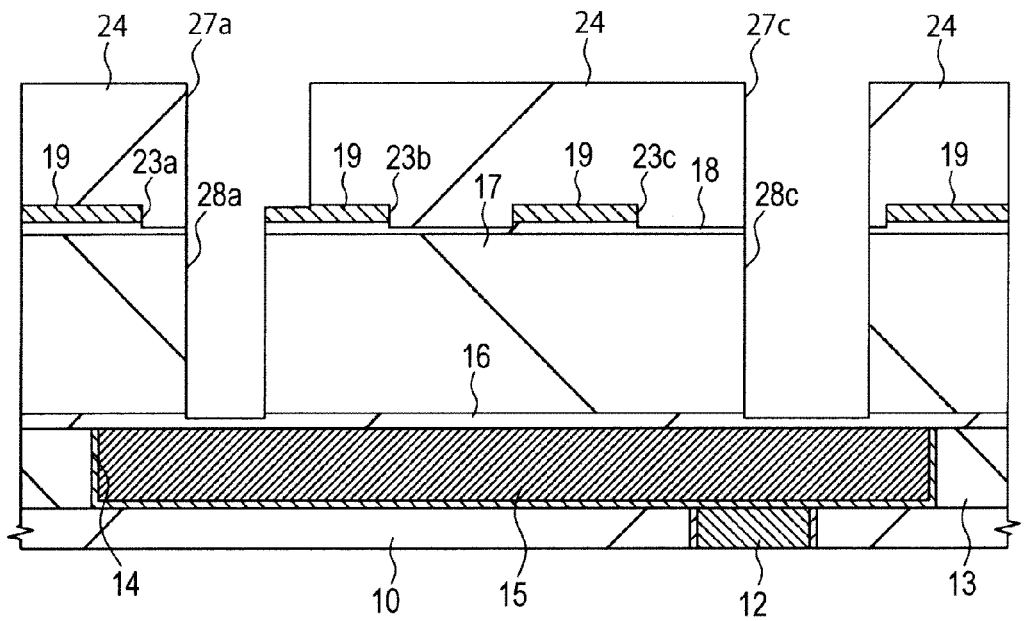
FIG. 16 is a cross-sectional view showing the manufacturing method of a semiconductor device following FIG. 15.

Next, as shown in FIG. 16, with the above-described two resist films (the intermediate layer 25 and the lower-layer resist film 24) as a mask, the insulating film 18 and the second interlayer insulating film 17 which underlie the metal hard mask layer 19 are dry etched. Then, by making use of a difference in etch selectivity between the second interlayer insulating film 17 and the liner film 16 lying therebelow, etching is stopped on the surface of the liner film 16. A via hole 28a is formed in the insulating film 18 and the second interlayer insulating film 17 in a region where the via hole pattern 27a is placed and a via hole 28c is formed in the insulating film 18 and the second interlayer insulating film 17 in a region where the via hole pattern 27c is placed. Although not shown in FIG. 16, a via hole 28b (refer to FIG. 17) is formed in the insulating film 18 and the second interlayer insulating film 17 in a region where the via hole pattern 27b (refer to FIG. 14) is placed.

Figure 17:
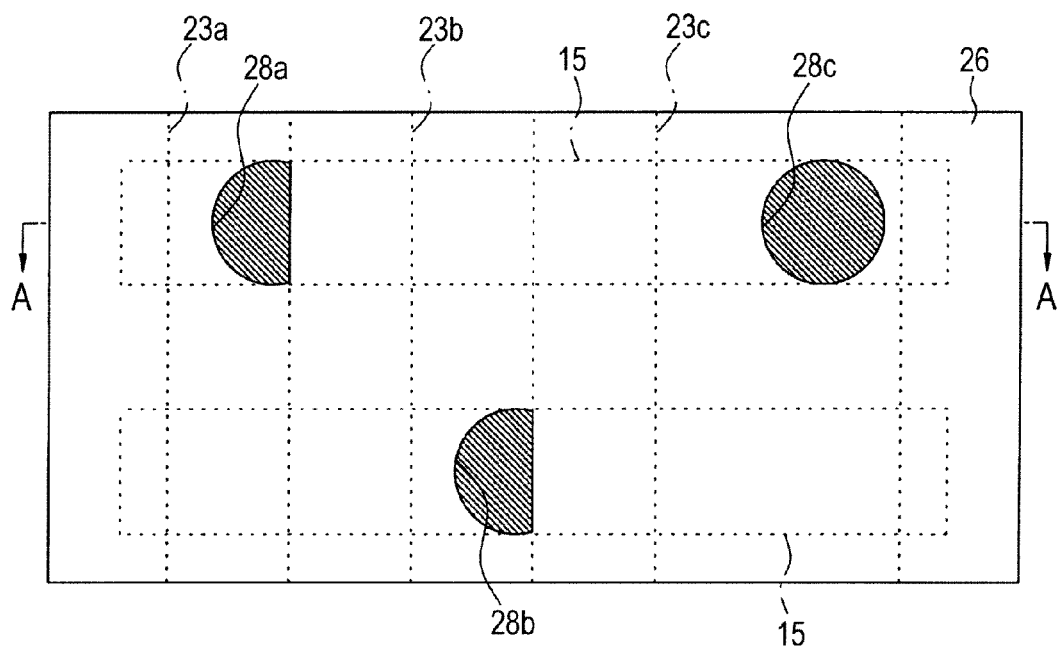
FIG. 17 is a plan view showing a planar shape of a via hole formed in an insulating film and a second interlayer insulating film.

Hatched regions in FIG. 17 show the planar shapes of the via holes 28a, 28b, and 28c formed in the insulating film 18 and the second interlayer insulating film 17. In addition, in FIG. 17, the planar shape of the first-level wiring 15 and the planar shapes of the wiring trench patterns 23a, 23b, and 23c are shown in a dotted line. FIG. 16 is a cross-sectional view taken along the line A-A of FIG. 17.

In the step of dry etching the lower-layer resist film 24 described above, a portion of the metal hard mask layer 19 is exposed from the bottom surfaces of the via hole patterns 27a and 27b due to misalignment of mask patterns (refer to FIG. 15). In the step of dry etching the insulating film 18 and the second interlayer insulating film 17 which underlie the metal hard mask layer 19, the exposed metal hard mask layer 19 also serves as an etching mask (refer to FIG. 16). As a result, the diameters of the via holes 28a and 28b, which have been formed in the insulating film 18 and the second interlayer insulating film 17, in a misalignment direction of the mask patterns (here, the extending direction of the first-level wiring 15) become smaller than the minimum processing size (=70 nm) of a circuit. The via hole patterns 28 and 28b each has a partially cut circular shape and they have both an arc portion and a linear portion. In other words, they are half-moon shaped.

On the other hand, in the region where the via hole pattern 27c is placed, the metal hard mask layer 19 is not exposed in the step of dry etching the intermediate-layer resist film 25 and the lower-layer resist film 24 (refer to FIG. 15). The via hole 28c formed in this region therefore has a diameter, along a misalignment direction of the mask patterns, greater than the diameter of the via hole 28a or 28b as shown in FIGS. 16 and 17.

In the step of etching the insulating film 18 and the second interlayer insulating film 17 with the three resist films (upper-layer resist film 26, intermediate-layer resist film 25, and lower-layer resist film 24) as a mask, the upper-layer resist film 26 or in addition, even the intermediate-layer resist film 25 are sometimes etched to disappear. Even in this case, when the lower-layer resist film 24 remains, the via holes 28a, 28b, and 28c can be formed without trouble.

Figure 18:
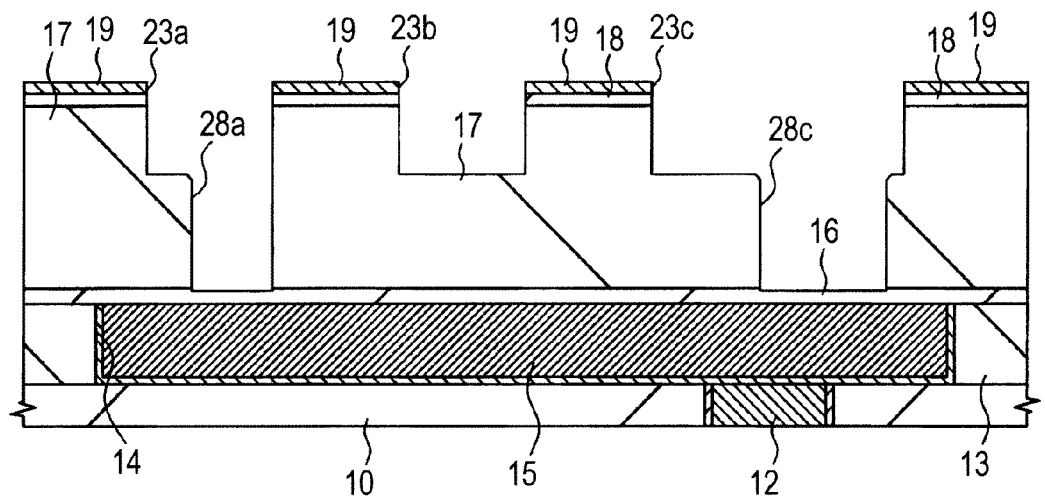
FIG. 18 is a cross-sectional view showing the manufacturing method of a semiconductor device following FIG. 16.

Next, after removal of the upper-layer resist film 26, the intermediate-layer resist film 25, and the lower-layer resist film 24 by asking, the insulating film 18 and the second interlayer insulating film 17 are dry etched with the metal hard mask layer 19 as a mask as shown in FIG. 18. FIG. 18 shows the state during the progress of etching of the second interlayer insulating film under which the liner film 16 is exposed from the bottom surface of the via holes 28a and 28c. At this time, although not illustrated in FIG. 18, the liner film 16 is also exposed from the bottom surface of the via hole 28b.

Figure 19:
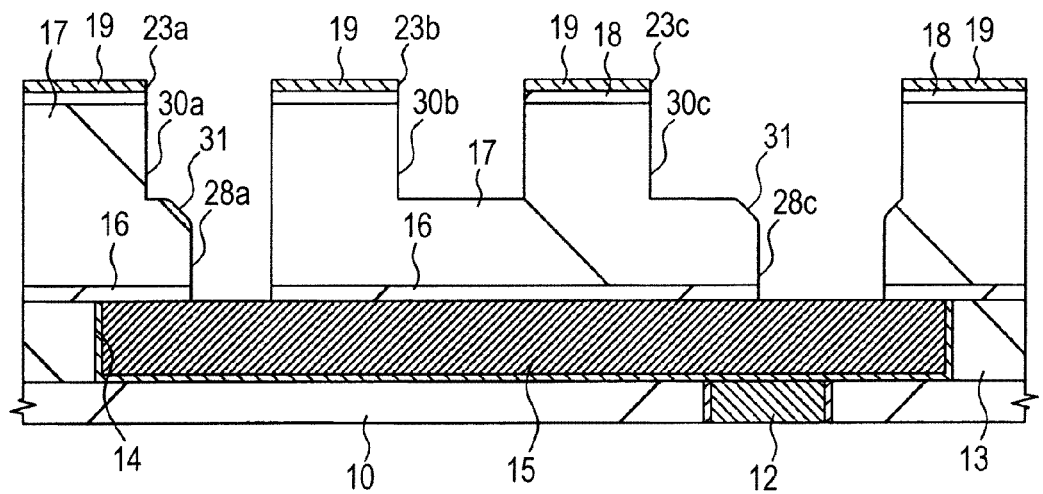
FIG. 19 is a cross-sectional view showing the manufacturing method of a semiconductor device following FIG. 18.

Then, as shown in FIG. 19, etching of the second interlayer insulating film 17 with the metal hard mask layer 19 as a mask is progressed further and at the same time, the liner film 16 exposed from the bottom surfaces of the via holes 28a and 28c is etched to expose the surface of the first-level wiring 15. Although not shown in FIG. 19, the liner film 16 exposed from the bottom surface of the via hole 28b is also etched to expose the surface of the first-level wiring 15 from the bottom surface of the via hole 28b. As a result, in the insulating film 18 and the second-interlayer insulating film 17 in a region where the wiring trench patterns 23a, 23b, and 23c are placed, wiring trenches 30a, 30b, and 30c of about 120 nm deep are formed and at the same time, via holes 28a, 28b, and 28c are completed.

In the above-described step of etching the second interlayer insulating film 17 to form wiring trenches 30a, 30b, and 30c, it is also possible to temporarily stop etching when the liner film 16 is exposed from the bottom surfaces of the via holes 28a, 28b, and 28c and then start etching of the liner film 16 with another etching gas or to successively carry out etching of the second interlayer insulating film 17 and etching of the liner film 16.

In the above-described step of etching the second interlayer insulating film 17, as shown in FIG. 19, the second interlayer insulating film 17 retreats (is recessed) obliquely downward at each opening portion (upper end portion) of each of the via holes 28a and 28c and a recess portion 31 having a tapered cross-sectional shape is formed. Although not shown in FIG. 19, a similar recess portion 31 is also formed at the opening portion of the via hole 28b. As a result, the diameter of each of the opening portions of the via holes 28a, 28b, and 28c becomes greater than the diameter of a region below the opening portion.

Thus, according to the above-described manufacturing method, even when there occurs misalignment between mask patterns of a via hole (via hole patterns 27a, 27b, and 27c) and mask patterns of a wiring trench (wiring trench patterns 23a, 23b, and 23c), via holes 28a and 28b having a diameter smaller than the minimum processing size of a circuit can be formed in self alignment with the metal hard mask layer 19.

Figure 20:
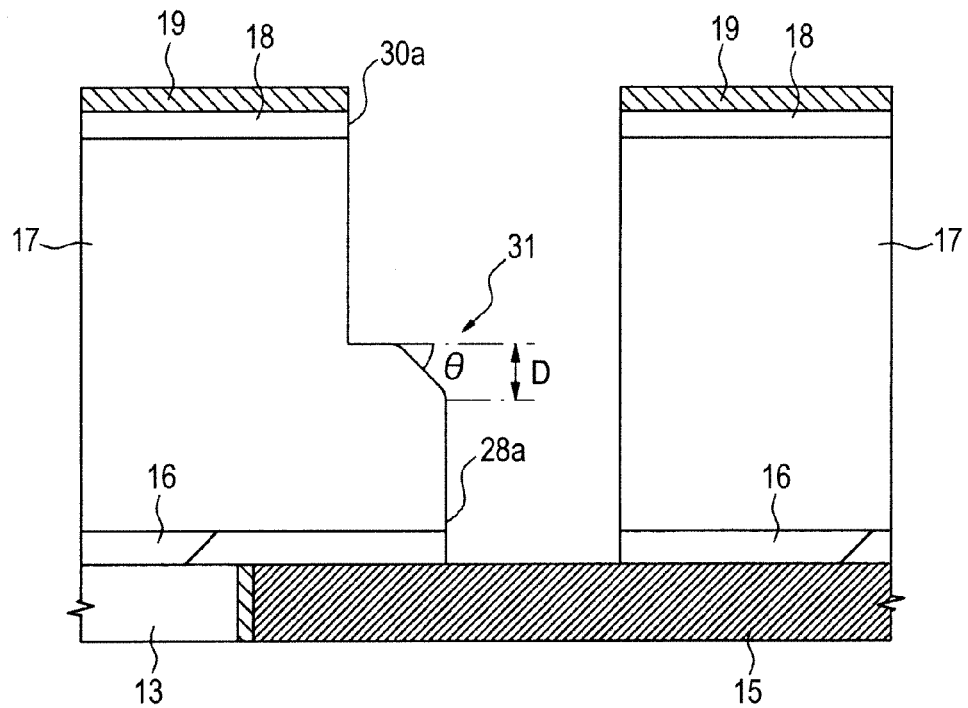
FIG. 20 is an enlarged cross-sectional view showing the vicinity of an opening portion of a via hole.

FIG. 20 is an enlarged cross-sectional view showing the vicinity of the opening portion of the via hole 28a. As shown in FIG. 20, a taper angle (θ) of the recess portion 31 formed at the opening portion of the via hole 28a, that is, an inclination of the recess portion 31 with respect to the bottom surface of the wiring trench 30a is about 45°. The depth (D) of the recess portion 31, that is, a vertical distance from the upper end portion to the bottom end portion of the recess portion 31 is about 35 nm. The taper angle (θ) of the recess portion 31 can be changed as needed within a range of from about 20° to 80°. The cross-sectional shape of the recess portion 31 is not limited to a tapered shape but may be a rounded shape.

Figure 21:
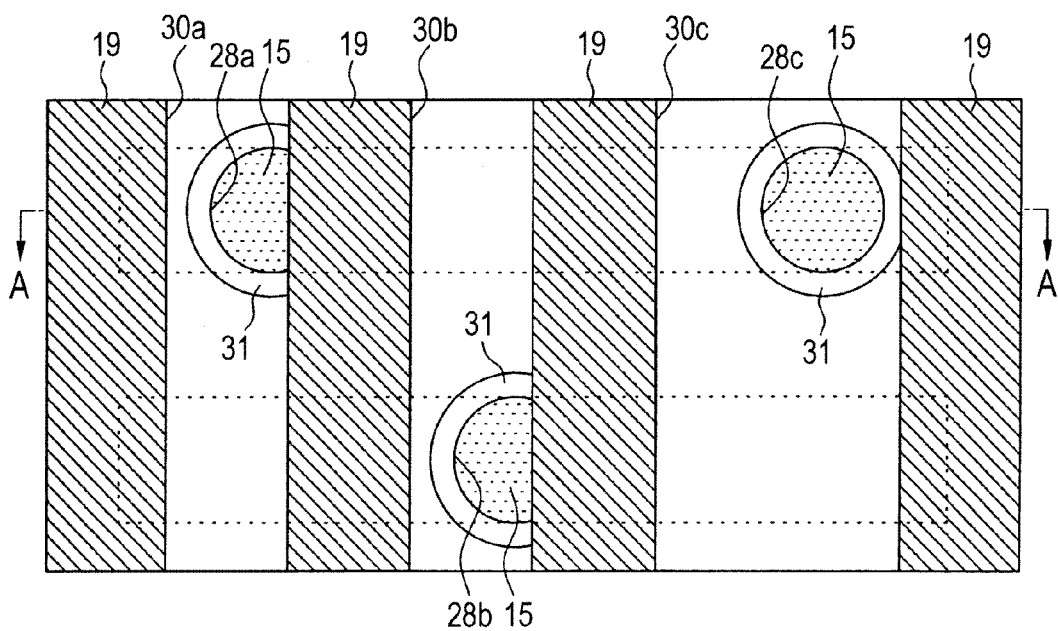
FIG. 21 is a plan view showing a planar shape of a wiring trench formed in an insulating film and a second interlayer insulating film.

FIG. 21 shows the planar shapes of the wiring trenches 30a, 30b, and 30c shown in FIG. 19. The hatched region in this drawing is the metal hard mask layer 19. FIG. 21 also shows the planar shapes of the via holes 28a, 28b, and 28c and the recess portion 31 formed at the opening portions thereof, and the surface of the first-level wiring 15 exposed from the bottom surface of the via holes 28a, 28b, and 28c. Incidentally, FIG. 19 is a cross-sectional view taken along the line A-A of FIG. 21.

Next, plasma treatment is performed in a reducing gas atmosphere such as hydrogen gas+nitrogen gas. By this treatment, an oxide formed on the surface of the first-level wiring 15 exposed from the bottom surfaces of the via holes 28a, 28b, and 28c is reduced so that the surface of the first-level wiring 15 is cleaned. In addition, foreign matters such as etching residues attached to the surface of the metal hard mask layer 19 are also removed.

The recess portion 31 at the opening portions of the via holes 28a, 28b, and 28c described above can also be formed by this plasma etching treatment. Alternatively, the recess portion 31 may be formed using the above-described etching of the second interlayer insulating film 17 and this plasma etching treatment in combination.

Figure 22:
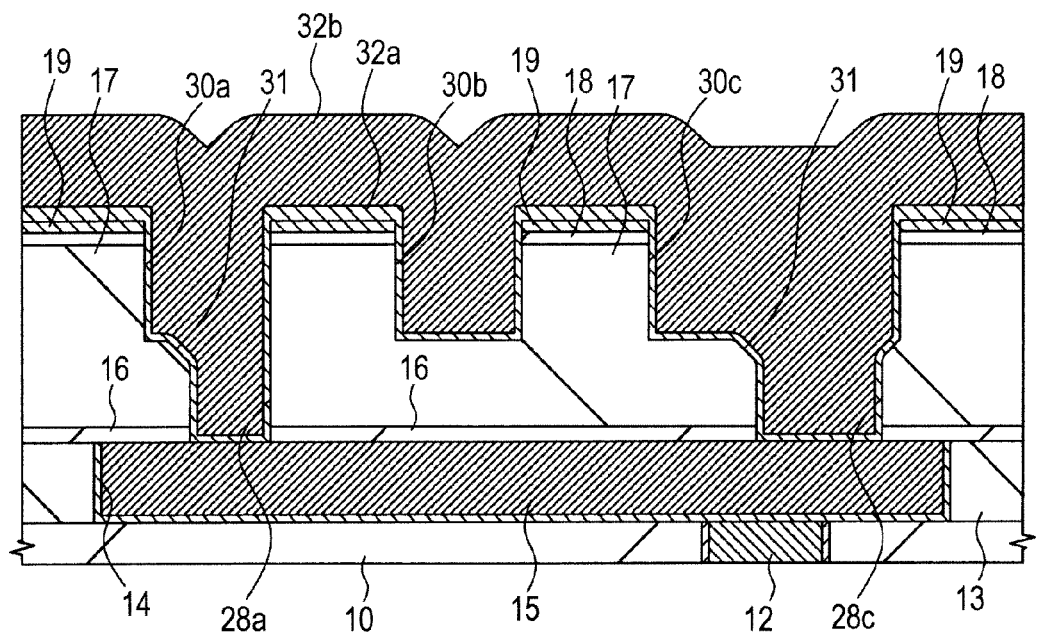
FIG. 22 is a cross-sectional view showing the manufacturing method of a semiconductor device following FIG. 19.

Next, as shown in FIG. 22, a barrier metal film 32a is deposited over the insulating film 18, on the bottom surface and side surfaces of the wiring trenches 30a, 30b, and 30c, and the bottom surface and side surfaces of the via holes 28a and 28c and then a Cu film 32b is deposited on the barrier metal film 32a. At this time, the barrier metal film 32a and the Cu film 32b are deposited in the via hole 28b not shown in FIG. 22.

The barrier metal film 32a is comprised of a TaN film of 5 nm thick deposited by sputtering and a Ta film of 5 nm thick deposited by sputtering on this TaN film. The Cu film 32b is comprised of a Cu seed film of 50 nm thick deposited by sputtering and a Cu film of 500 nm thick deposited on the Cu seed film by electroplating. The Cu seed film is comprised of an alloy film obtained by adding, to Cu which is a main component, a trace element such as Al, Si, Ge, Ga, Sn, or Mn so that by the heat treatment after deposition of the Cu film, the trace element in the Cu seed film which underlies the Cu film, diffuses into the Cu film deposited by electroplating. The Cu film thus becomes a Cu alloy film. The barrier metal film 32a is formed in order to prevent the Cu film 32b, which is a wiring material, from diffusing into the second interlayer insulating film 17 around the wiring trenches 30a, 30b, and 30c.

As described above, the recess portion 31 is formed at the opening portion of each of the via holes 28a, 28b, and 28c so that the opening portion has a diameter greater than that of a region therebelow. It is therefore possible to fully fill the barrier metal film 32a and the Cu film 32b not only in the via hole 28c but even in the via holes 28a and 28b having a diameter smaller than the minimum processing size of a circuit.

After the plasma treatment in a reducing gas atmosphere but prior to the step of depositing the barrier metal film 32a, sputter etching treatment with an argon ion (Ar$^+$) may be conducted. This treatment eliminates oxides formed on the surface of the first-level wiring 15 exposed from the bottom surfaces of the via holes 28a, 28b, and 28c or an etching residue of the metal hard mask layer 19 attached to the surface of the first-level wiring layer 15 and thereby cleaning the surface of the first-level wiring 15. This sputter etching treatment may be utilized for forming the recess portion 31. Further, the recess portion 31 may be formed by using the above-described etching of the second interlayer insulating film 17a or the plasma treatment in a reducing gas atmosphere in combination with this sputter etching treatment.

Figure 23:
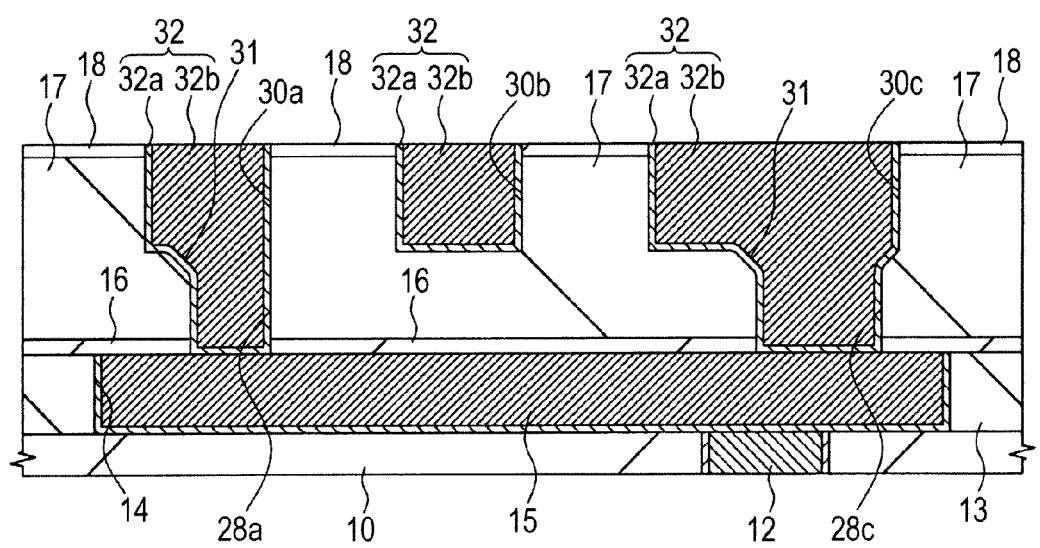
FIG. 23 is a cross-sectional view showing the manufacturing method of a semiconductor device following FIG. 22.

Next, as shown in FIG. 23, the Cu film 32b, the barrier metal 32a, and the metal hard mask layer 19 which lie over the insulating film 18 are polished and removed by chemical mechanical polishing. As a result, a second-level wiring 32 comprised of the barrier metal film 32a and the Cu film 32b is formed in the wiring trench 30a and the via hole 28a. In addition, a similar second-level wiring 32 is formed in the wiring trench 30c and the via hole 28c. Moreover, a similar second-level wiring 32 is formed also in the wiring trench 30b and the via hole 28b not shown in FIG. 23.

Figure 24:
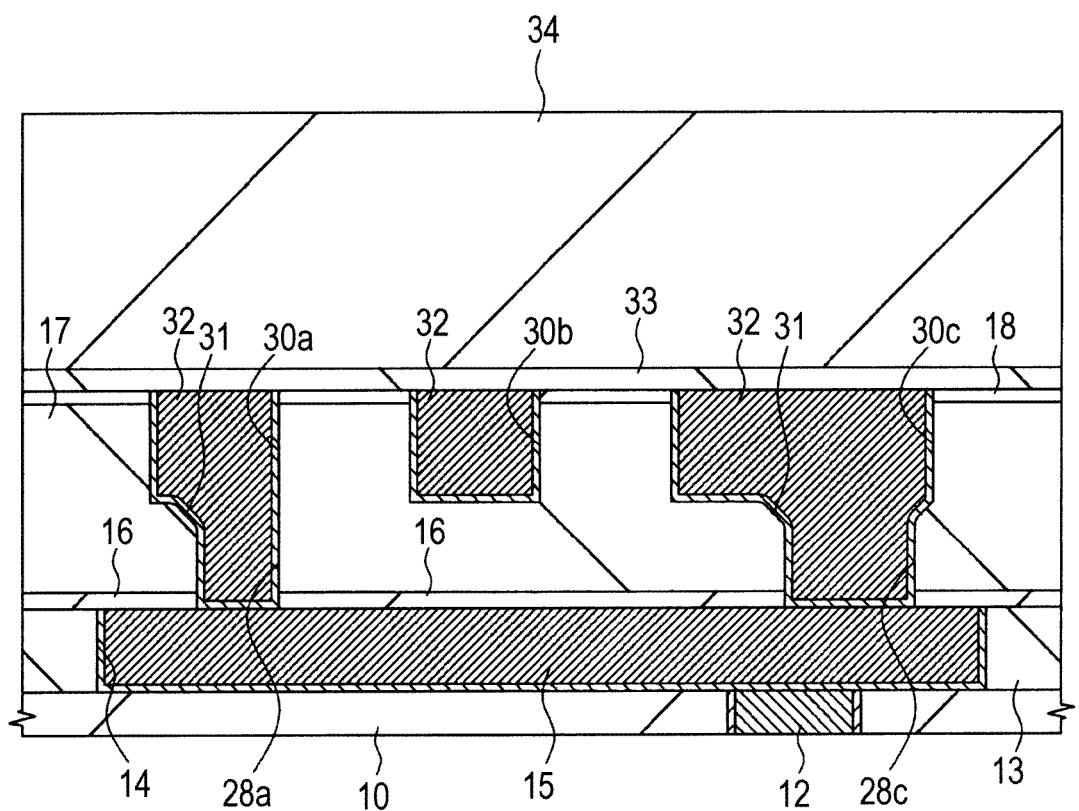
FIG. 24 is a cross-sectional view showing the manufacturing method of a semiconductor device following FIG. 23.

Next, as illustrated in FIG. 24, a liner film 33 is deposited on the insulating film 18 and the second-level wiring 32, followed by deposition of a third interlayer insulating film 34 on the liner film 33. The liner film 33 is an insulating barrier metal film for preventing Cu, which is a main component of the second-level wiring 32, from diffusing in the third interlayer insulating film 34. It also functions as an etching stopper film to be used upon formation of a via hole in the third interlayer insulating film 34 in a step described later. The liner film 33 is, similar to the underlying liner film 16, comprised of a SiC film, a SiCN film, a SiN film, or the like film and it is deposited with a thickness (for example, from 50 nm to 80 nm, more preferably from 50 nm to 70 nm) greater than that of the underlying liner film 16.

The third interlayer insulating film 34 is comprised of, for example, a SiOC film having a dielectric constant of about 3. Although the underlying interlayer insulating films (the first interlayer insulating film 13 and the second interlayer insulating film 17) are each comprised of an extremely low dielectric constant film such as porous SiOC film in order to reduce the parasitic capacitance of wiring, a third-level wiring (which will be described later) formed in the third interlayer insulating film 34 has a wider wiring-to-wiring space than that of the first-level wiring 15 or the second-level wiring 32. The third interlayer insulating film 34 is therefore comprised of a low dielectric constant film denser than the extremely low dielectric constant film from the standpoint of its film quality. In addition, the third interlayer insulating film 34 is deposited with a greater thickness (for example, 400 nm) than that of the underlying second interlayer insulating film 17.

Figure 25:
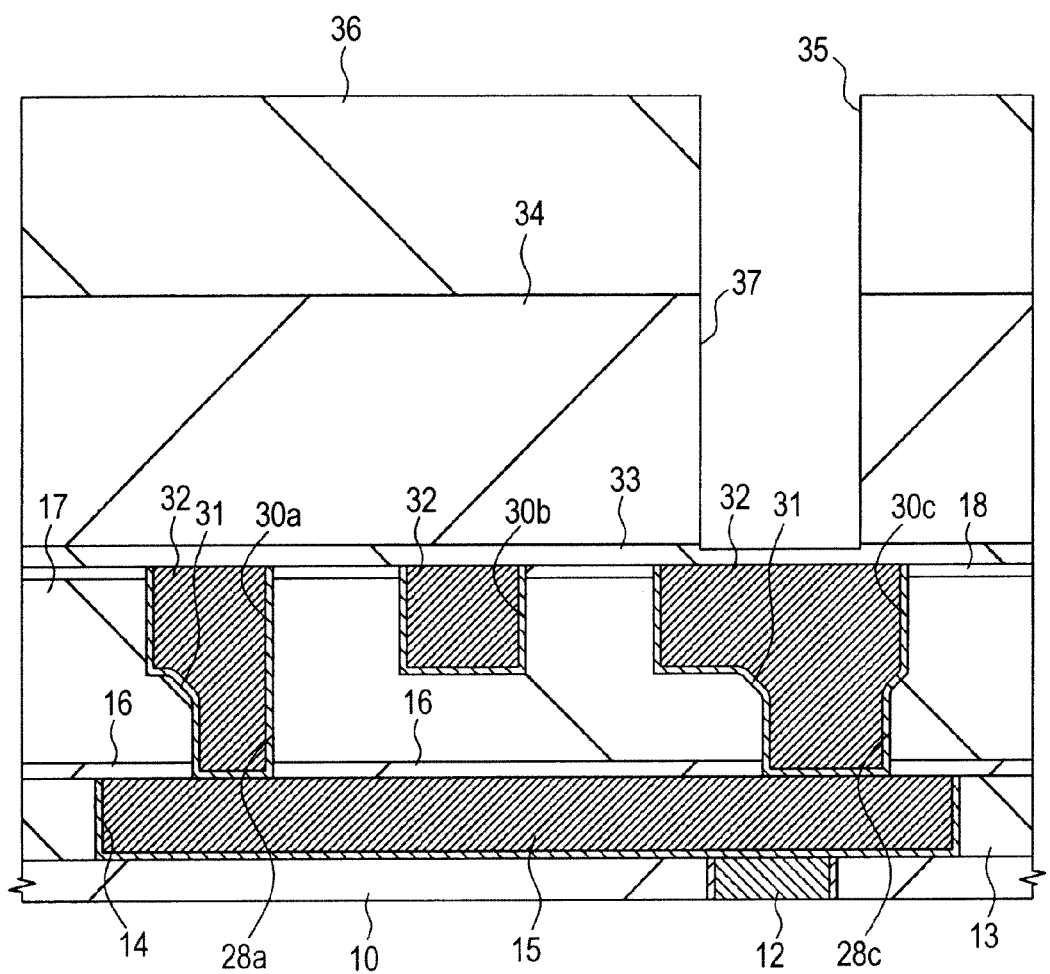
FIG. 25 is a cross-sectional view showing the manufacturing method of a semiconductor device following FIG. 24.
Figure 26:
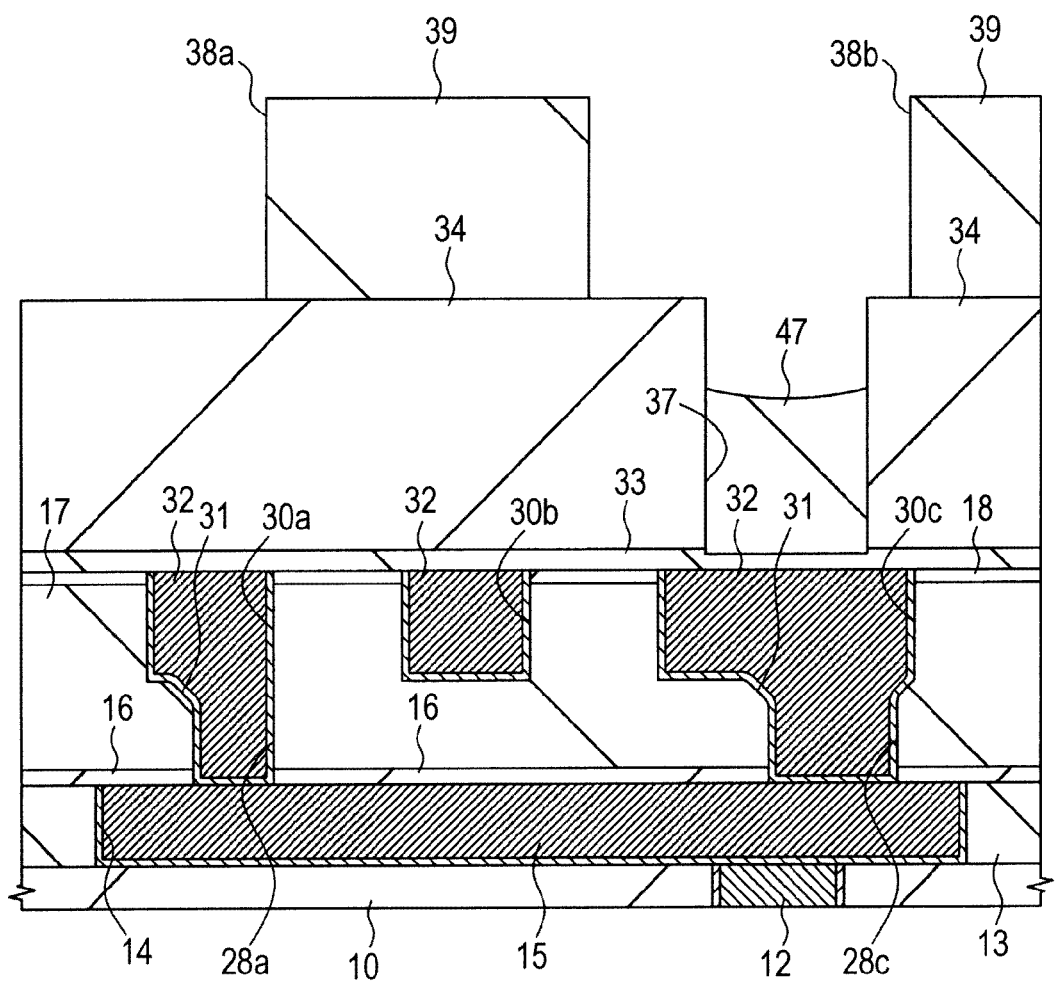
FIG. 26 is a cross-sectional view showing the manufacturing method of a semiconductor device following FIG. 25.

Next, as shown in FIG. 25, a photoresist film 36 to which via hole patterns 25 have been transferred is formed on the third interlayer insulating film. By dry etching with this photoresist film 36 as a mask, a via hole 37 is formed in the third interlayer insulating film 34 over the second-level wiring 32. At this time, the liner film 33 serving as an etching stopper film is exposed from the bottom portion of the via hole 37.

Next, after removal of the photoresist film 36 by asking, a photoresist film 39 to which wiring trench patterns 38a and 38b have been transferred is formed on the third interlayer insulating film. At this time, an organic film has been desirably filled in the via hole 37. This organic film can prevent etching of the liner film 33 exposed from the bottom portion of the via hole 37 upon etching of the third interlayer insulating film 34 in the next step so that undesirable etching of the second-level wiring 32 at the bottom of the via hole 37 can be prevented.

The width of each of the wiring trench patterns 38a and 38b transferred to the photoresist film 39, that is, the line width of the third-level wiring formed in the third interlayer insulating film 34 in the next step is greater than the line width of the first-level wiring 15. In addition, the space between the wiring trench pattern 38a and the wiring trench pattern 38b, that is, the space between two adjacent third-level wirings is greater than the minimum space between the first-level wirings 15. Further, the diameter of the via hole 37 formed in the third interlayer insulating film 34 is greater than the diameter of each of the via holes 28a, 28b, and 28c.

As described above, the line width (L2) of the second-level wiring 32 formed in the second interlayer insulating film 17 and the space (S2) between two adjacent wirings are each equal to the minimum processing size of a circuit in the wiring layer in which they are formed. The diameter of each of the via holes 28a, 28b, and 28c formed on the bottom surface of the second-level wiring 32 is equal to or not greater than the minimum processing size of a circuit in the layer in which they are formed.

In this embodiment, a wiring layer, like the second-level wiring 32, whose minimum line width and minimum space between two adjacent wiring layers are each the smallest of all the wiring layers is called "fine wiring" and a wiring layer whose minimum line width and minimum space between two adjacent wiring layers are each greater than those of the fine wiring is called "semi-global wiring". An uppermost-level wiring (which will be described later) formed over the semi-global wiring is called "global wiring". In this global wiring, the minimum line width and the minimum space between two adjacent wirings are each greater than those of the semi-global wiring and this global wiring is typically comprised of not a Cu alloy film but an Al alloy film.

Semiconductor devices having multilayer Cu wiring have generally a plurality of the fine layers and semi-global layers. In the present embodiment, to facilitate viewing of the drawings, the first-level wiring 15 and the second-level wiring 32 are shown as the fine wiring layer. A third-level wiring which will be formed in the following step is shown as the semi-global wiring layer and a fourth-level wiring formed over the third-level wiring is shown as the uppermost-level wiring (global wiring layer).

Figure 27:
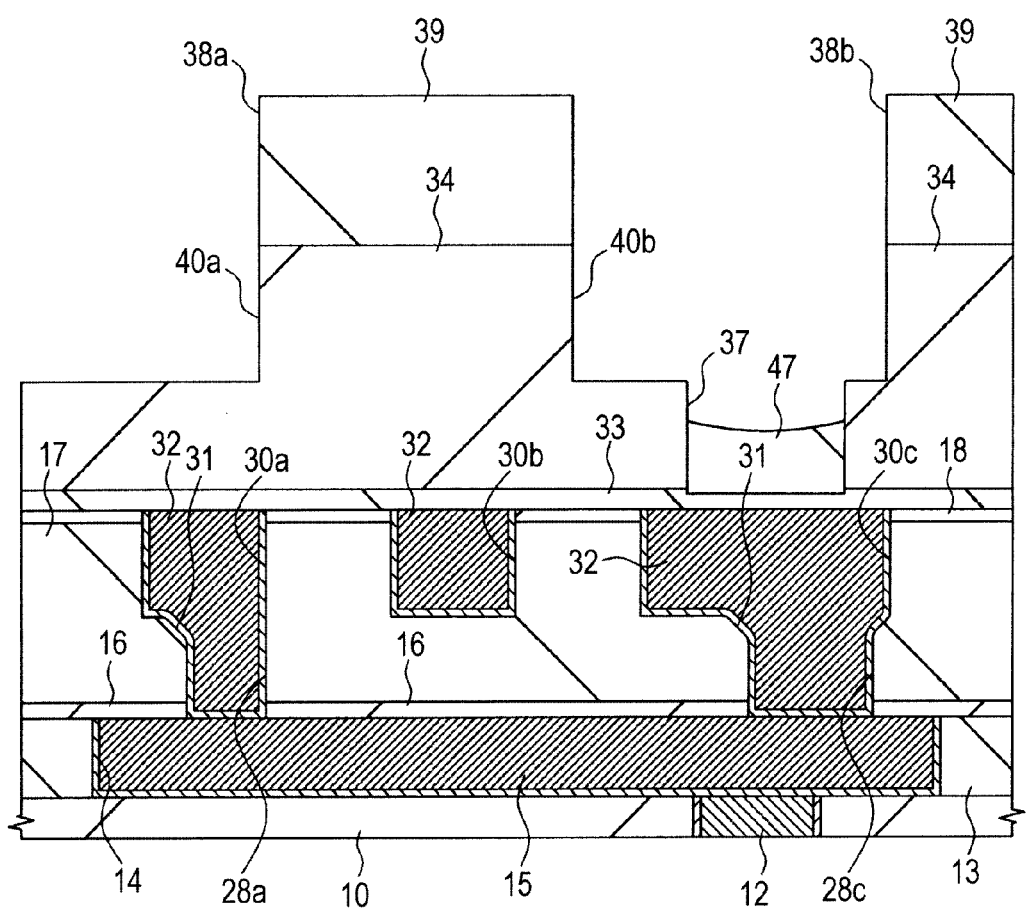
FIG. 27 is a cross-sectional view showing the manufacturing method of a semiconductor device following FIG. 26.

Next, as shown in FIG. 27, wiring trenches 40a and 40b are formed in the third interlayer insulating film 34 by partially dry etching the third interlayer insulating film 34 with the photoresist film 39 as a mask. During this etching, the photoresist film 39 on the third interlayer insulating film 34 and the organic film 47 buried in the via hole 37 are each etched to retreat so that an opening portion (upper end portion) of the via hole 37 is exposed from the bottom of the wiring trench 40b.

In addition, in the etching step of the third interlayer insulating film 34, the third interlayer insulating film 34 at the opening portion of the via hole 37 is slightly etched, but its retreat (recess) amount is very small. This means that in the above-described step of forming the wiring trenches 30a, 30b, and 30c in the second interlayer insulating film 17, the second interlayer insulating film 17 at the opening portion of each of the via holes 28a and 28c retreats obliquely downward and the recess portion 31 having a tapered cross-sectional shape is formed (refer to FIG. 19). The recess portion formed at the opening portion of the via hole 37 in the step of forming wiring trenches 40a and 40b in the third interlayer insulating film 34 is smaller in size than the recess portion 31 formed at the opening portion of each of the via holes 28a and 28c. Such a difference occurs because the second interlayer insulating film 17 is comprised of a porous extremely low dielectric constant (ELK) film and therefore has a soft film quality (for example, an elastic modulus of about 7.5 GPa), while the third interlayer insulating film 34 comprised of a SiOC film or the like has a film quality harder (for example, an elastic modulus of about 20 GPa) than that of the extremely low dielectric constant (ELK) film.

Figure 28:
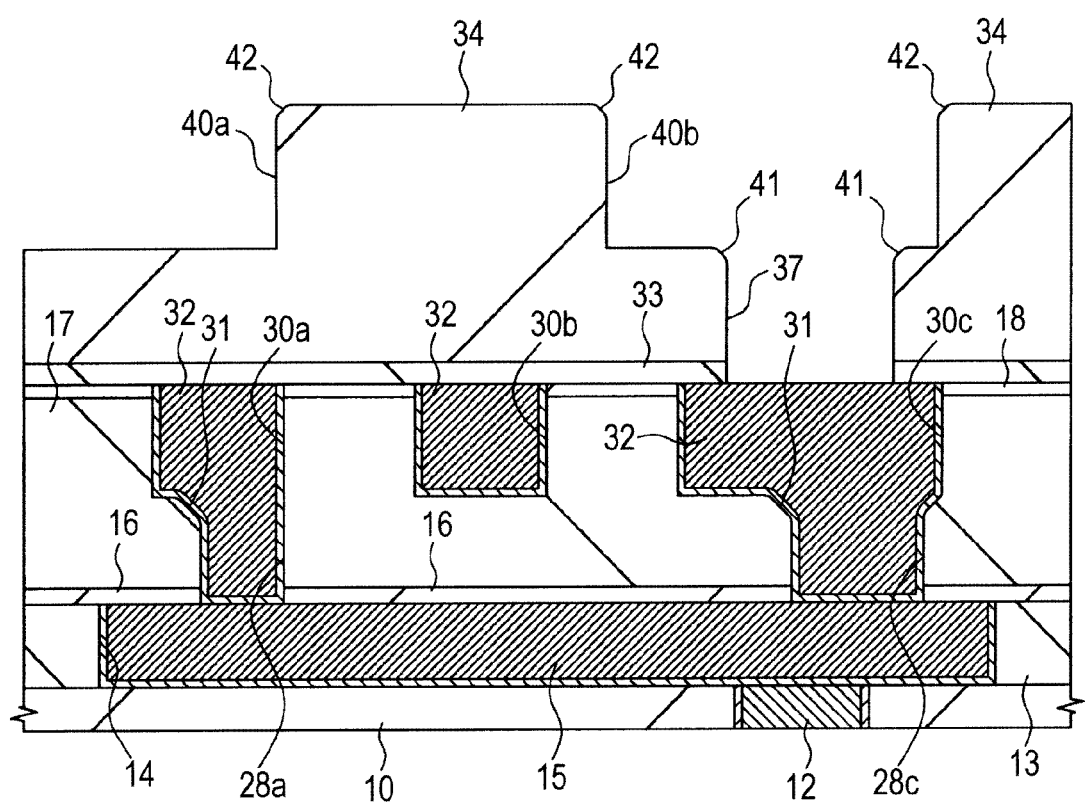
FIG. 28 is a cross-sectional view showing the manufacturing method of a semiconductor device following FIG. 27.

Next, after removal of the photoresist film 39 on the third interlayer insulating film 34 and the organic film 47 in the via hole 37 by asking, the liner film 33 at the bottom of the via hole 37 is removed by etchback to expose the second-level wiring 32, as shown in FIG. 28. At this time, at the opening portion of the via hole 37, the third interlayer insulating film 34 is etched obliquely downward and retreats to form a recess portion 41 having a tapered cross-sectional shape. Further, the third interlayer insulating film 34 is etched obliquely downward at the opening portion of the wiring trenches 40a and 40b to form a recess portion 42 having a tapered cross-sectional shape.

In the via hole 37 after etchback of the liner film 33, there remains a residue of the photoresist film 39 or a residue of the liner film 33. After etchback of the liner film 33, wet cleaning may therefore be conducted for removing the residue in the via hole 37. As well as this wet cleaning, sputter etching with an Ar gas or a mixed gas of helium (He) and argon, annealing in an atmosphere containing from a few percent to 100% of hydrogen ($H_2$) (for example, at from 100° C. to 350° C. for from 10 seconds to 180 seconds), or (remote) plasma processing may be employed for cleaning.

Figure 29:
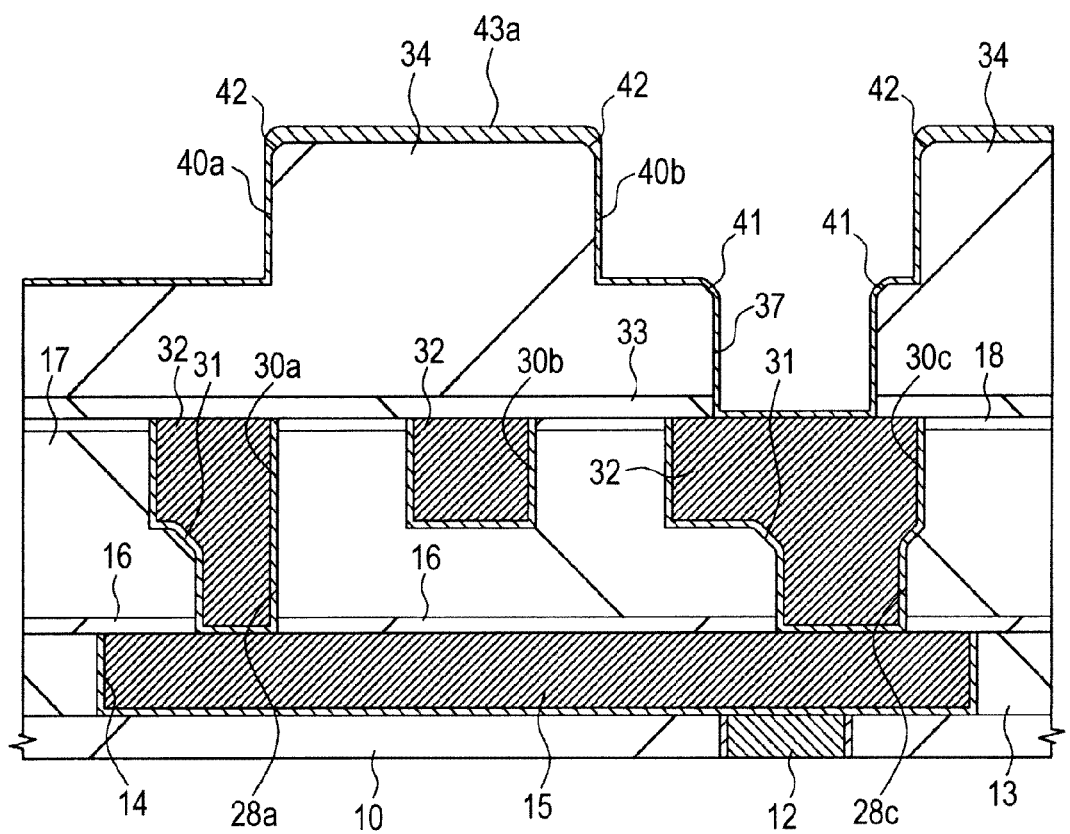
FIG. 29 is a cross-sectional view showing the manufacturing method of a semiconductor device following FIG. 28.

Next, as shown in FIG. 29, a first barrier metal film 43a is deposited on the insulating film 34, on the bottom surface and side surfaces of each of the wiring trenches 40a and 40b, and on the bottom surface and the side surfaces of the via hole 37. The first barrier metal film 43a is comprised of, for example, a TaN film of 20 nm thick deposited by sputtering. The first barrier metal film 43a may be comprised of a metal nitride film other than the TaN film, for example, a TiN film or a WN film.

Although not illustrated, a high-resistance reaction layer is formed on the interface between the second-level wiring 32 exposed from the bottom surface of the via hole 37 and the first barrier metal film 43a due to the deposition of the first barrier metal film 43a. This reaction layer is a reaction product between an element (for example, Al) added to a Cu alloy film constituting the second-level wiring 32 and nitrogen (N) in a metal nitride film (a TaN film in this case) constituting the first barrier metal film 43a. Such a reaction product, if formed, increases electrical resistance on the interface between the third-level wiring formed in the via hole 37 in a step described later and the second-level wiring 32 exposed from the bottom surface of the via hole 37 or causes variation in this electrical resistance.

Figure 30:
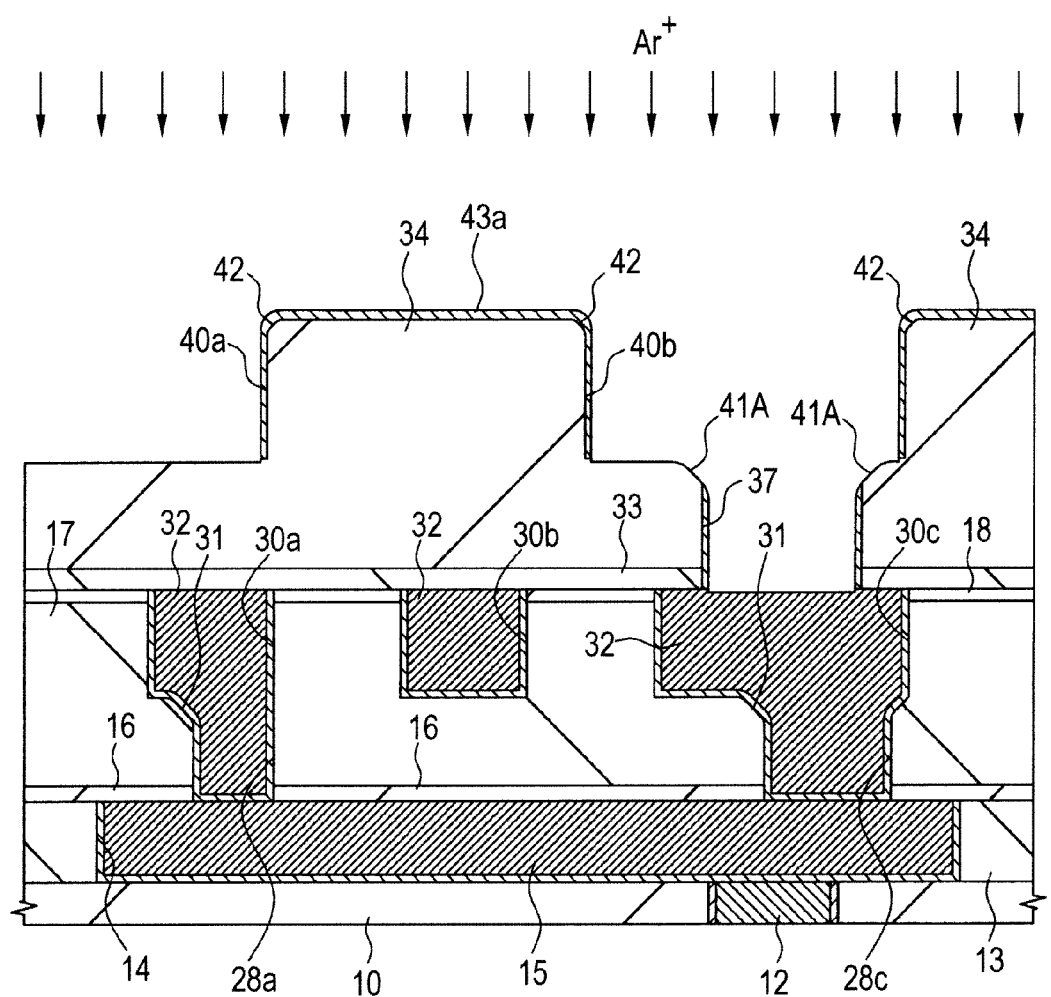
FIG. 30 is a cross-sectional view showing the manufacturing method of a semiconductor device following FIG. 29.

Next, in a chamber of a sputtering apparatus in which deposition of the first barrier metal film 43a was performed, sputter etching with argon ion ($Ar^+$) or the like is performed, by which the first barrier metal film 43a on the bottom surface of each of the wiring trenches 40a and 40b is removed and the third interlayer insulating film 34 is exposed as shown in FIG. 30. In addition, the first barrier metal film 43a on the bottom surface of the via hole 37 is removed to expose the second-level wiring 32. The first barrier metal film 43a which has remained on the side surface of the via hole 37 has been, at the lower end portion thereof, coupled to the second-level wiring 32. It is to be noted that by this sputter etching treatment, a portion of the third interlayer insulating film 34 on the bottom surface of the wiring trenches 40a and 40b may be etched to increase the depth of the wiring trenches 40a and 40b or a portion of the second interlayer insulating film 32 on the bottom of the via hole 37 is etched to form a semicircular or conical trench.

Since the above-described sputter etching treatment can remove the reaction product formed on the interface between the second-level wiring 32 and the first barrier metal film 43a, an increase or variation of electrical resistance on this interface can be suppressed. For suppressing the formation of the reaction product further, decreasing the concentration of an element incorporated in the Cu film 32b, which constitutes the second-level wiring 32, to 0.04 wt % or less is also effective.

The above-described sputter etching treatment also removes the first barrier metal film 43a which has covered the opening portion (recess portion 41) of the via hole 37. The surface of the third interlayer insulating film 34 exposed from the opening portion of the via hole 37 is retreated by sputter etching. As a result, a recess portion 41A greater in retreat amount than the recess portion 31 formed at the opening portion of the via holes 28a, 28b, and 28c in the underlying layer is formed so that the diameter of the opening portion of the via hole 37 becomes greater further.

Thus, in the present embodiment, the third interlayer insulating film 34 having a hard film quality and exposed from the opening portion of the via hole 37 is etched by making use of the step of removing the liner film 33 on the bottom of the via hole 37 by etchback (refer to FIG. 28) and the step of removing a reaction product on the interface between the second-level wiring 32 and the first barrier metal film 43a by etchback (refer to FIG. 30). As a result, the recess portion 41A having a great recess amount can be formed at the opening portion of the via hole 37 and thereby, the diameter of the opening portion of the via hole 37 can be increased.

It is to be noted that the first barrier metal film 43a deposited on the third interlayer insulating film 34 in the step of FIG. 29 has usually a thickness greater than the first barrier metal film 43a deposited in the wiring trenches 40a and 40b and in the via hole 37. Even after the sputter etching treatment, the first barrier metal film 43a slightly remains on the third interlayer insulating film 34. The third interlayer insulating film 34 at the opening portion (recess portion 42) of the wiring trenches 40a and 40b therefore does not retreat upon the sputter etching treatment.

Figure 31:
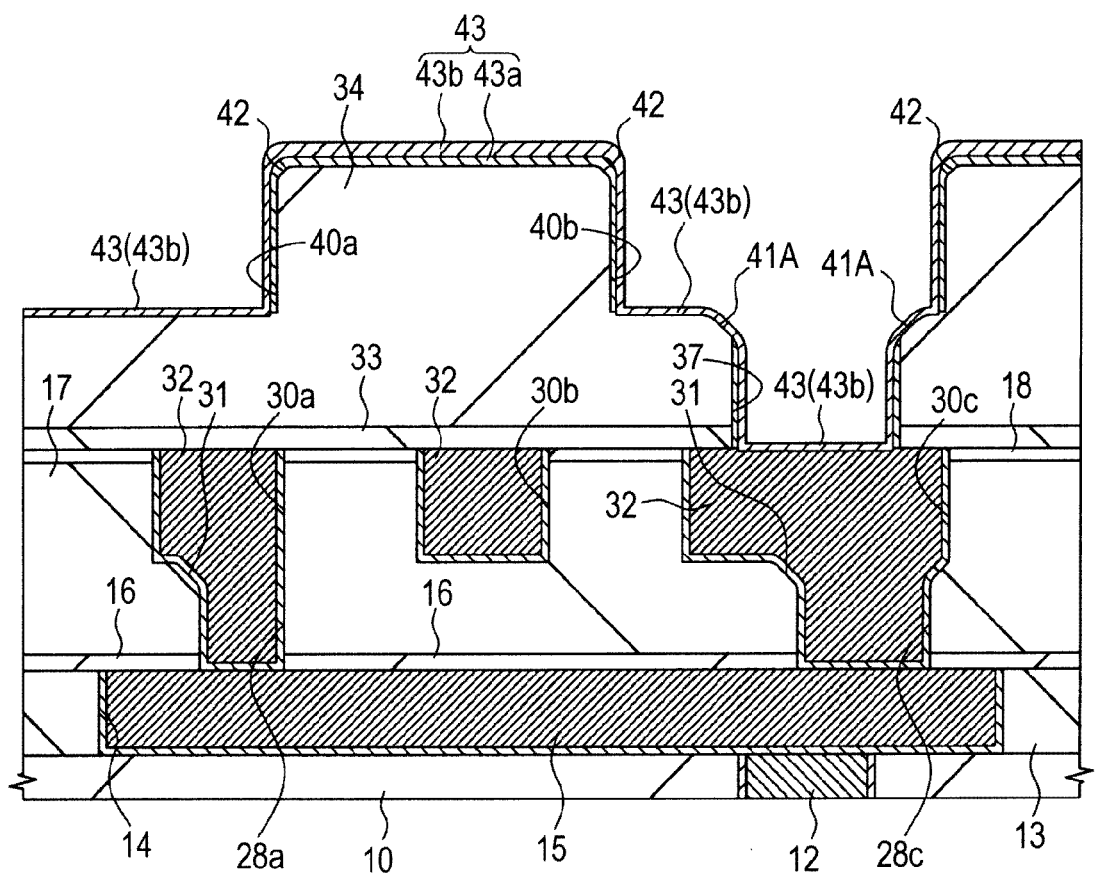
FIG. 31 is a cross-sectional view showing the manufacturing method of a semiconductor device following FIG. 30.

Next, as shown in FIG. 31, a second barrier metal film 43b is deposited over the third interlayer insulating film 34, on the bottom surface and side surfaces of the wiring trenches 40a and 40b, and the bottom surface and side surfaces of the via hole 37. The second barrier metal film 43b is comprised of, for example, a Ta film of 20 nm thick deposited by sputtering. The second barrier metal film 43b may be comprised of a Ti film or a W film instead of the Ta film.

As described above, the recess portion 41A having a great retreat amount is formed at the opening portion of the via hole 37, making it possible to fully fill the via hole 37 with the second barrier metal film 43b.

As a result, a barrier metal film 43 comprised of a film stack of the first barrier metal film 43a and the second barrier metal film 43b is formed on the side surface of the wiring trenches 40a and 40b and the side surface of the via hole 37. In addition, the barrier metal film 43 comprised of a film stack of the first barrier metal film 43a and the second barrier metal film 43b is also formed on the third interlayer insulating film 34. On the other hand, the first barrier metal film 43a is removed on the bottom surface of the wiring trenches 40a and 40b and the bottom surface of the via hole 37 by the above-described sputter etching treatment so that the barrier metal film 43 comprised only of the second barrier metal film 43b is formed. The barrier metal film 43 is formed to prevent diffusion of a Cu film which will be deposited in the wiring trenches 40a and 40b in a subsequent step into the third interlayer insulating film 34 around the wiring trenches 40a and 40b.

Incidentally, the above-described sputter etching treatment with argon ion ($Ar^+$) or the like and deposition treatment of the second barrier metal film 43b may be performed in one step and in one chamber; or removal of the first barrier metal film 43a which has covered the opening portion (recess portion 41) of the via hole 37, formation of the recess portion 41A with a great retreat amount, and deposition of the second barrier metal film 43b may be conducted while adjusting the processing conditions to enable processing of an adequate amount.

Figure 32:
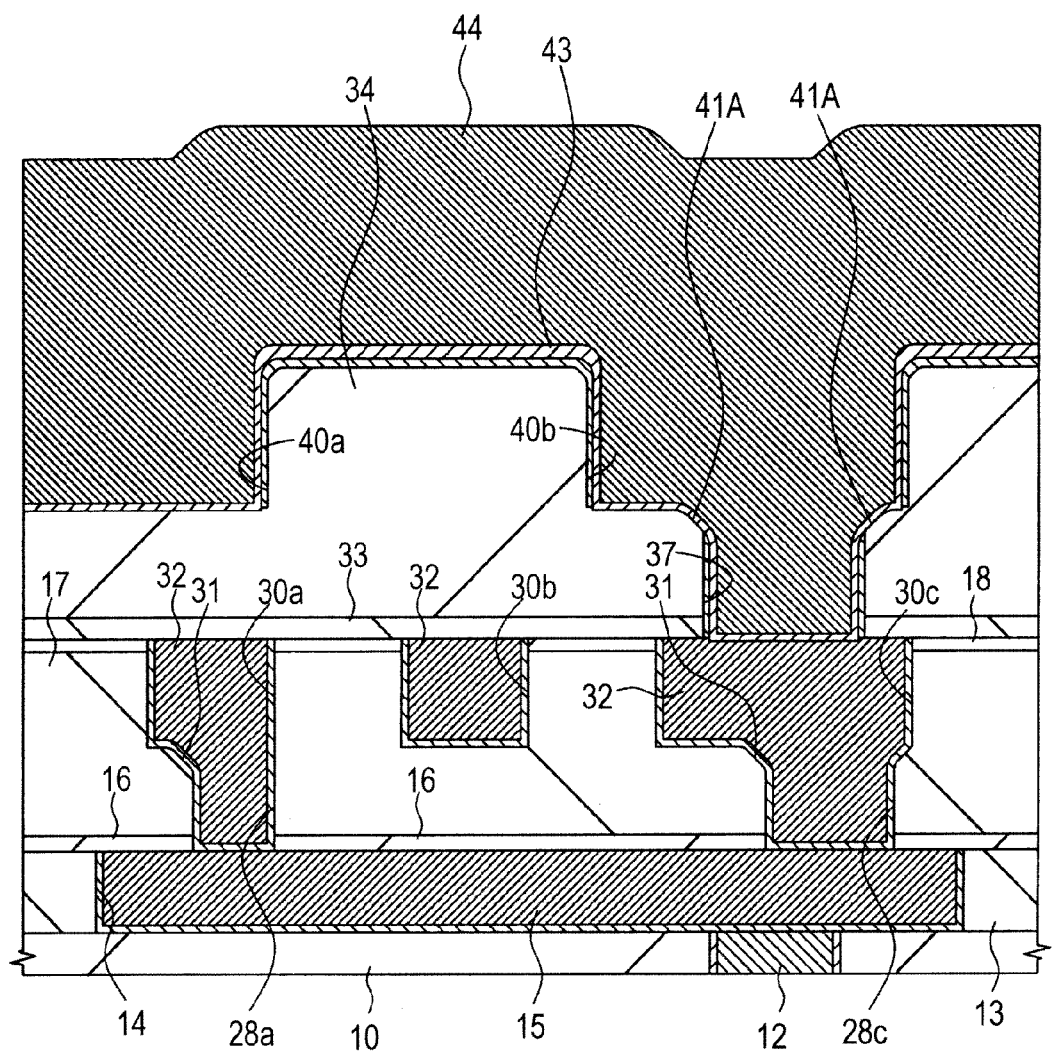
FIG. 32 is a cross-sectional view showing the manufacturing method of a semiconductor device following FIG. 31.

Next, as shown in FIG. 32, a Cu film 44 is deposited on the barrier metal film 43. The Cu film 44 is comprised of a Cu seed film deposited by sputtering and a Cu film deposited by electroplating. The Cu seed film is an alloy film obtained by adding, to Cu which is a main component, a trace element such as Al, Si, Ge, Ga, Sn, or Mn. By the heat treatment after deposition of the Cu film 44, the trace element in the Cu seed film is diffused into the Cu film deposited by electroplating and the film thus becomes a Cu alloy film.

As described above, the recess portion 41A with a great retreat amount is formed at the opening portion of the via hole 37 so that the Cu film 44 can be fully filled in the via hole 37.

Figure 33:
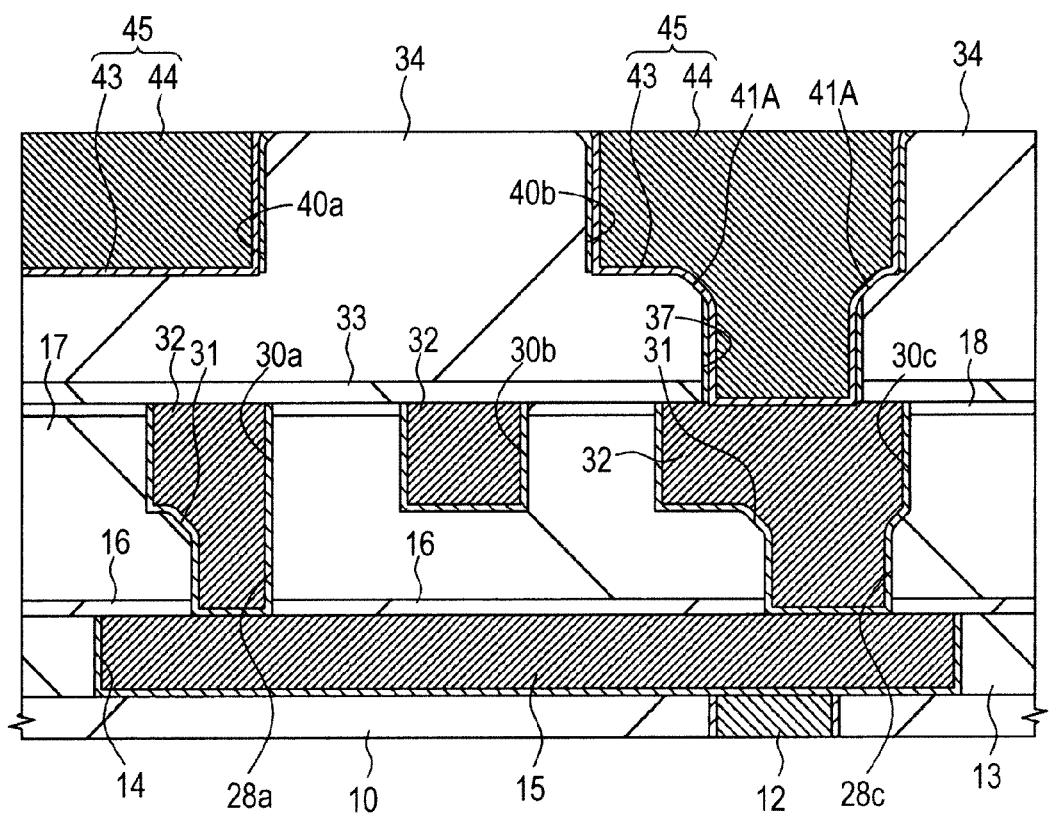
FIG. 33 is a cross-sectional view showing the manufacturing method of a semiconductor device following FIG. 32.

Next, as shown in FIG. 33, the Cu film 44 and the barrier metal film 43 on the third interlayer insulating film 34 are polished and removed by chemical mechanical polishing, by which a third-level wiring 45 comprised of the barrier metal film 43 and the Cu film 44 is formed in the wiring trenches 40a and 40b and in the via hole 37.

The third-level wiring 45 formed in the wiring trench 40b and in the via hole 37 lying therebelow is free of electromigration or stress migration since the second-level wiring 32 is fully filled in the wiring trench 30c and the via hole 28c which have been placed below the third-level wiring.

Figure 34:
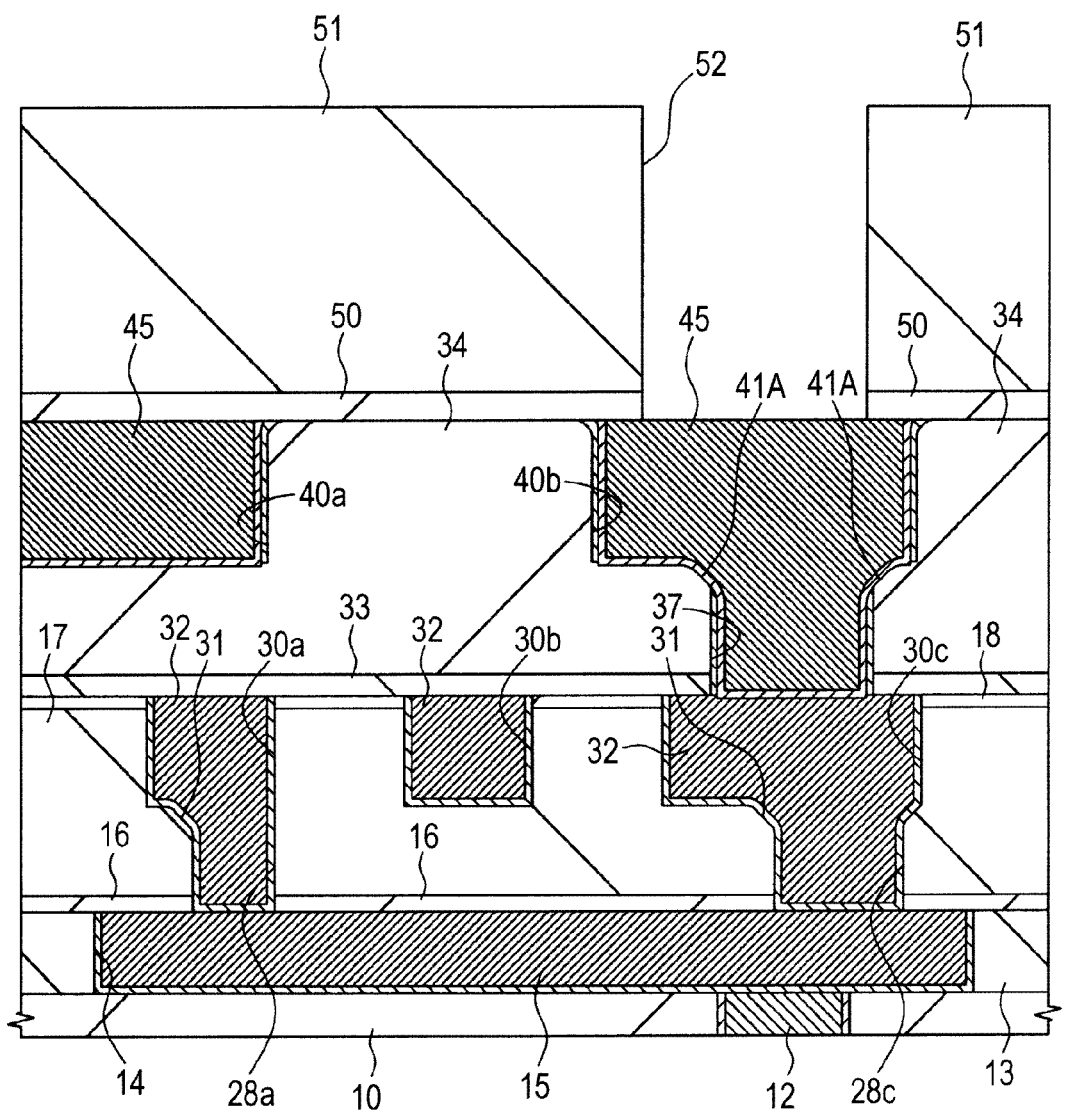
FIG. 34 is a cross-sectional view showing the manufacturing method of a semiconductor device following FIG. 33.

Next, as shown in FIG. 34, after deposition of a liner film 50 and a fourth interlayer insulating film 51 on the third interlayer insulating film 34 and the third-level wiring 45, the fourth interlayer insulating film 51 and the liner film 50 are dry etched with a photoresist film (not shown) with a mask to form a contact hole 52 on the third-level wring 45. The liner film 50 is comprised of a SiC film, SiCN film, or the like, while the fourth interlayer insulating film 51 is comprised of a silicon oxide-based insulating film such as TEOS film deposited by plasma CVD.

Figure 35:
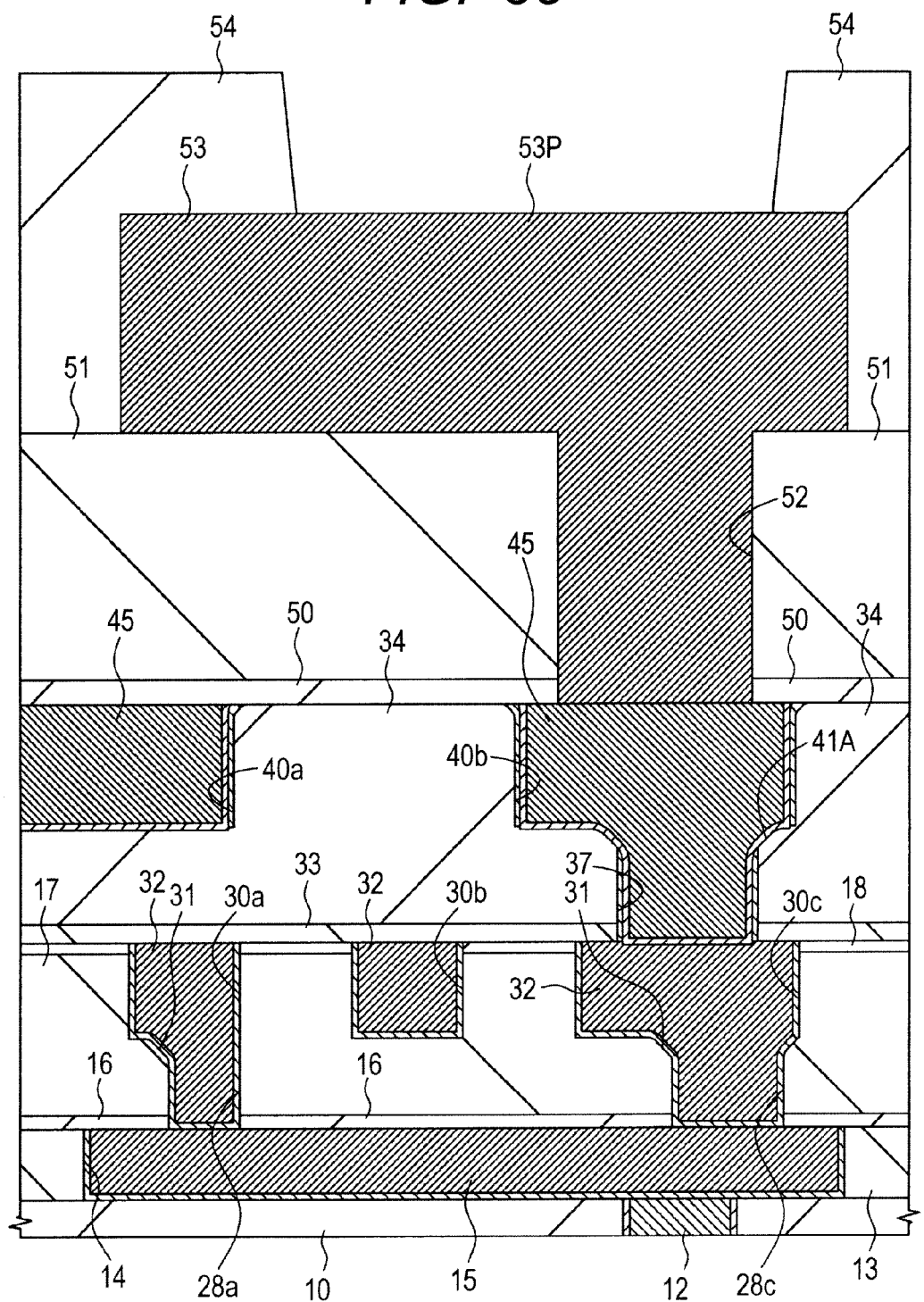
FIG. 35 is a cross-sectional view showing the manufacturing method of a semiconductor device following FIG. 34.

Next, as shown in FIG. 35, by patterning an Al alloy film deposited on the fourth interlayer insulating film 51 and in the contact hole 52, a fourth-level wiring 53 which is an uppermost wiring (global wiring) is formed. Then, after deposition of a surface protective film 54 on the fourth-level wiring 53, the surface protective film 54 is dry etched with a photoresist film (not shown) as a mask to expose a portion of the fourth interlayer insulating film 51 and form an electrode pad 53P. The surface protective film 54 is comprised of, for example, a film stack of a silicon oxide film and a silicon nitride film. By the steps described above, a semiconductor device of the present embodiment is completed.

Thus, in the present embodiment, when via holes to be filled with wiring materials (barrier metal film and Cu film) are formed in a low-hardness interlayer insulating film of a lower layer and a high-hardness interlayer insulating film of an upper layer, respectively, a recess portion with a desired retreat amount can be formed at the opening portion of each of the via holes.

This means that an interlayer insulating film in which fine wirings are formed has low hardness and is thin because it is comprised of a porous insulating film with a low dielectric constant. Upon etching of a liner film on the bottom of the via hole formed in this interlayer insulating film, a proper retreat (recess) occurs.

On the other hand, an interlayer insulating film in which semi-global wirings are formed is comprised of a low dielectric constant film with higher hardness than that of a porous insulating film and it is thick. At the same time, the liner film on the bottom of the via hole formed in this interlayer insulating film is thicker than the liner film of the lower layer. A proper retreat (recess) amount can therefore be attained by both the retreat (recess) upon etching of the liner film on the bottom of the via hole formed in this interlayer insulating film and a punch-through treatment.

Via holes formed in two or more interlayer insulating films different in hardness can therefore be fully filled with wiring materials so that a semiconductor device having multilayer wiring can have improved reliability and production yield.

Second Embodiment

This embodiment provides a semiconductor device similar to that of First Embodiment but further improved as follows in via holes of fine wirings.

In First Embodiment, a method of fully filling via holes formed in a low-hardness interlayer insulating film of a lower layer and a high-hardness interlayer insulating film of an upper layer, respectively, was described.

On the other hand, in the case where two or more via holes different in diameter are formed simultaneously in the same interlayer insulating film, when an edge loss at the recess portion is large in a via hole with a large diameter, a ratio of the depth of the via hole to the diameter of the opening portion of the via hole decreases. This results in excessive deposition of a barrier metal film having higher resistance than a Cu film on the bottom of the via hole, leading to an increase in resistance of wiring materials filled in the via hole.

In addition, when the edge loss at the recess portion becomes large, the depth of the recess portion itself varies greatly, the thickness of the barrier metal film on the bottom or sidewall of the via hole varies greatly, and as a result, the resistance of the wiring materials filled in the via hole varies greatly. On the other hand, in a via hole with a great diameter, a ratio of the depth of the via hole to the diameter of the opening portion of the via hole decreases, which suppresses the above-described problem, that is, excessive deposition of a barrier metal film on the bottom of the via hole. There is however a fear of insufficient filling of wiring materials in a via hole when the ratio of the depth of a via hole to the diameter of the opening portion of the via hole is small.

Thus, the depth of the recess portion formed at the opening portion of the via hole (D-C, that is, E described above referring to FIG. 39) has an optimum range depending on the diameter of the via hole. When a via hole with a large diameter (for example, the via hole 28c in First Embodiment) and a via hole with a small diameter (for example, the via holes 28a and 28b in First Embodiment) are formed simultaneously, it is desired to optimize the etching conditions so that the depth (E) of the recess portion 31 becomes large in the via hole 28a with a small diameter and the depth (E) of the recess portion 31 becomes small in the via hole 28c with a large diameter.

One example of a method of increasing the depth (E) of the recess portion 31 in the via hole 28a with a small diameter and decreasing the depth (E) of the recess portion 31 in the via hole 28c with a large diameter will next be described. Here, a description on the via hole 28b is omitted.

Figure 36:
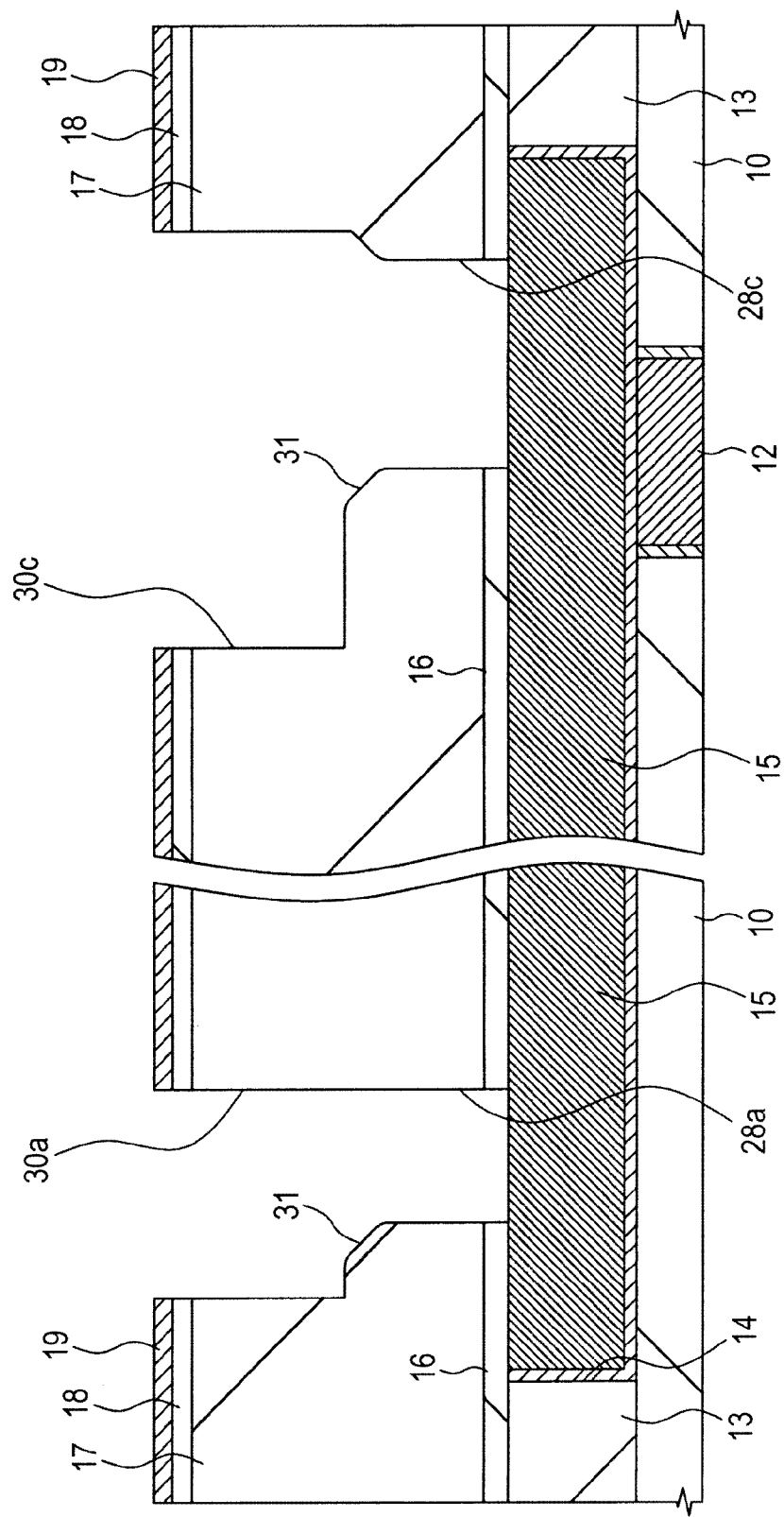
FIG. 36 is a cross-sectional view showing a manufacturing method of a semiconductor device according to Second Embodiment of the invention.

First, as shown in FIG. 36, in accordance with the step shown in FIG. 19 of First Embodiment, by forming wiring trenches 30a, 30b, and 30c in the insulating film 18 and the second interlayer insulating film 17 and at the same time, etching the liner film 16 exposed from the bottom surface of via holes 28a, 28b, and 28c, formation of the via holes 28a and 28c is completed. At this time, recess portions 31 are respectively formed at the opening portions of the via holes 28a, 28b, and 28c. The recess portion 31 formed at the opening portion of the small-diameter via holes 28a and 28b and the recess portion 31 formed in the opening portion of the large-diameter via hole 28c are substantially equal in depth (E).

Next, a barrier metal film 32a is deposited using sputtering. As described above, the barrier metal film 32a is comprised of a film stack of a TaN film and a Ta film deposited on this TaN film.

Figure 37:
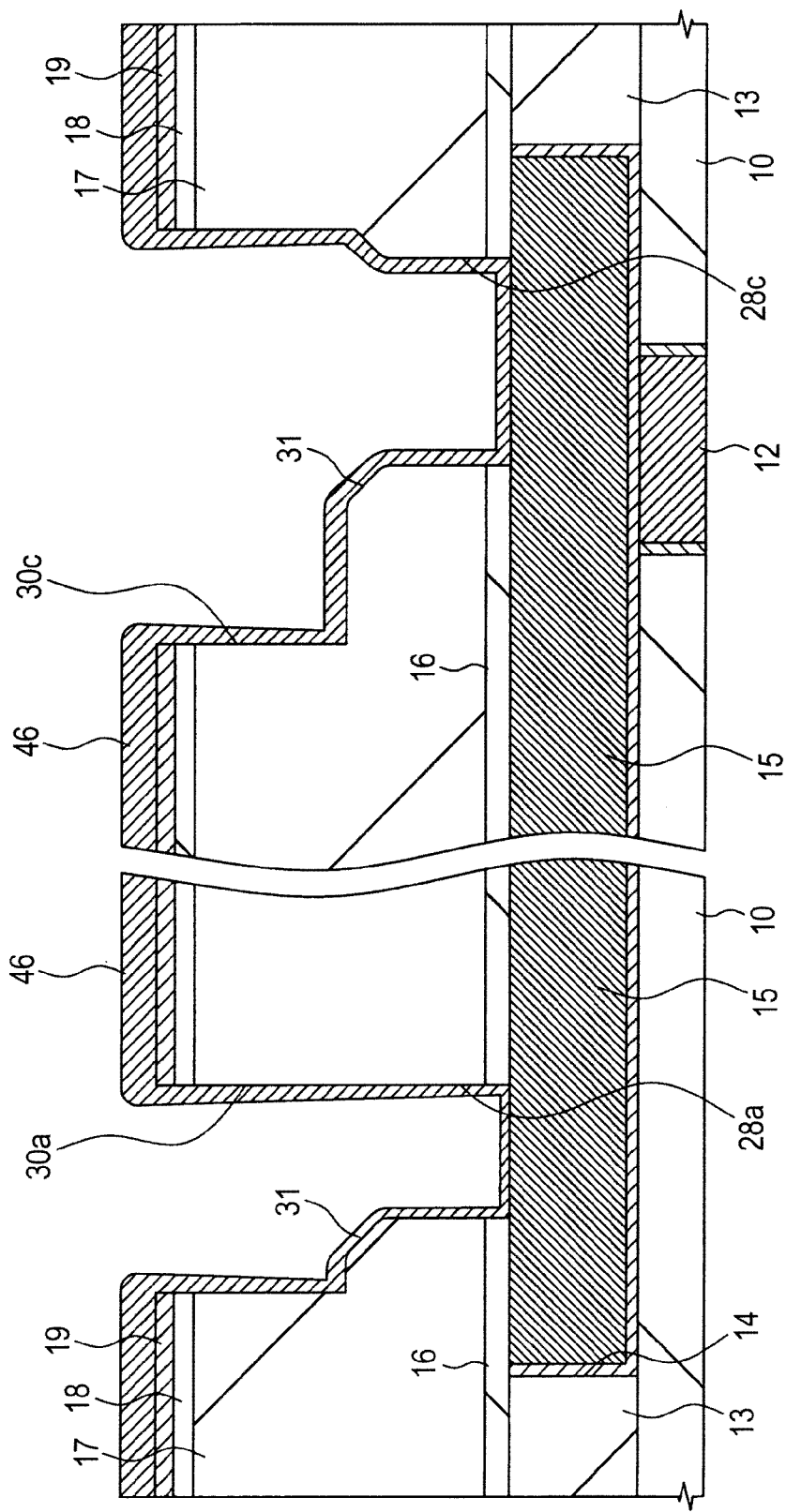
FIG. 37 is a cross-sectional view showing the manufacturing method of a semiconductor device following FIG. 36.
Figure 38:
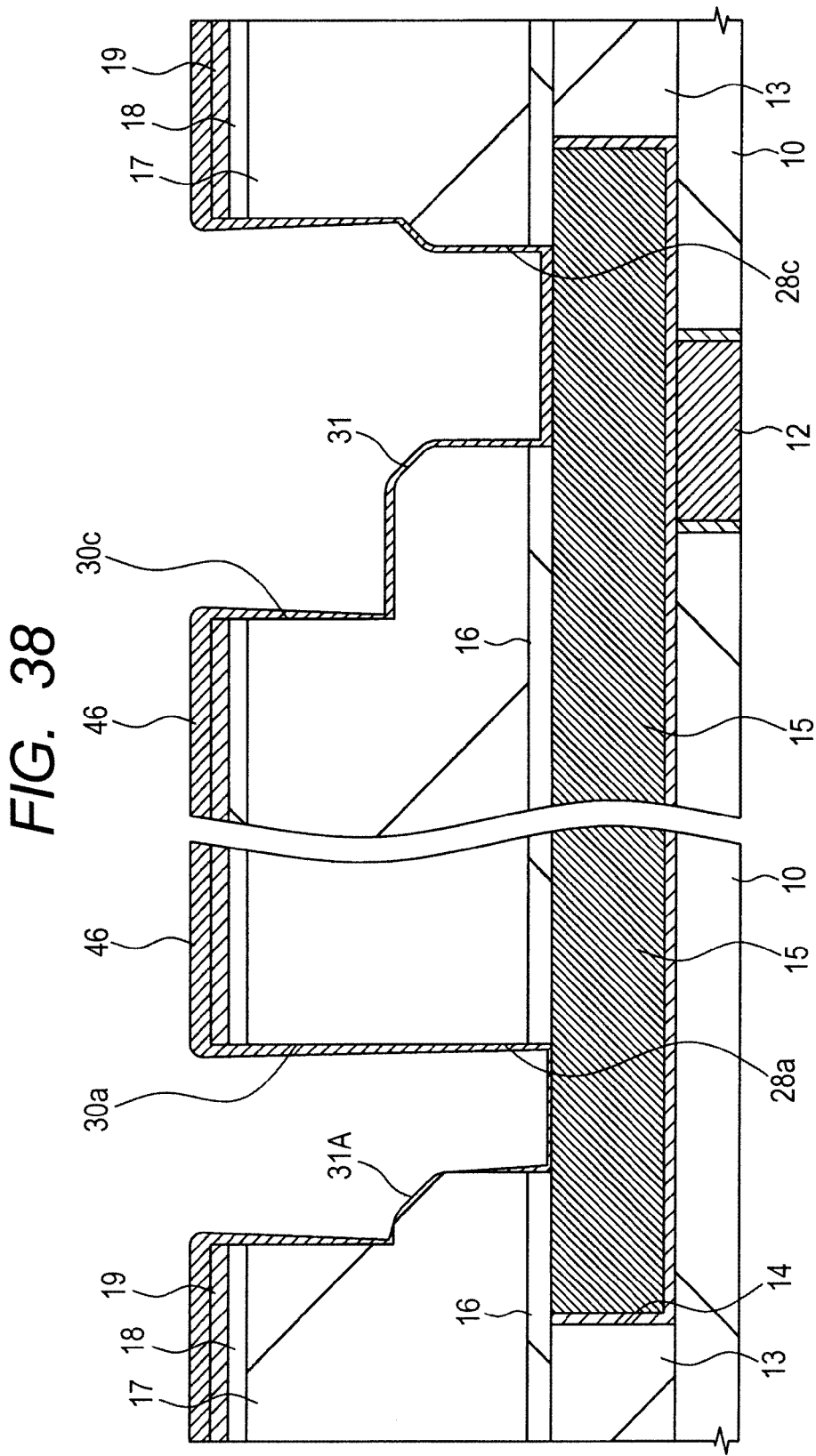
FIG. 38 is a cross-sectional view showing the manufacturing method of a semiconductor device following FIG. 37.

FIG. 37 is an enlarged cross-sectional view showing the vicinity of the via holes 28a and 28c in which the TaN film 46, which is a lower-layer portion of the barrier metal film 32a, has been deposited by typical sputtering. As illustrated in FIG. 37, when the TaN film 46 is simultaneously deposited in two via holes 28a and 28c different in diameter, the thickness of the TaN film 46 in the small-diameter via hole 28 usually becomes smaller than the thickness of the TaN film 46 in the large-diameter via hole 28c, because the smaller the diameter of the via hole, the less the amount of the TaN film 46 filled therein.

In this embodiment, when the TaN film 46 is deposited using sputtering, the deposition of the TaN film 46 and sputter etching are conducted simultaneously. Described specifically, an inert gas such as argon is supplied to a chamber of a sputtering apparatus and sputter etching with an argon ion ($Ar^+$) is conducted while forming the TaN film 46. Sputtering is conducted, for example, under the following conditions: DC power applied to a sputter target=500 W, RF power applied to the semiconductor substrate 1=400 W, power applied to an RF coil=1200 W, power applied to a DC coil=0 W, and argon flow rate=15 sccm. In general, when a ratio of a film forming component (TaN film 46) to an etching component (argon ion) falls within a range of from 10 to 90%, the sputtering conditions may be controlled within the following ranges: DC power applied to a sputter target=from 500 W to 1000 W, RF power applied to the semiconductor substrate 1=from 300 W to 1000 W, power applied to an RF coil=from 800 W to 2000 W, and power applied to a DC coil=from 0 to 1000 W.

As a result, since the deposition amount of the TaN film 46 is small at the opening portion of the small-diameter via hole 28a, the second interlayer insulating film 17 at the opening portion is etched and retreated and a recess portion 31A with a great depth (D) is formed. On the other hand, in the opening portion of the large-diameter via hole 28c, the deposition amount of the TaN film 46 is large and a larger amount of the TaN film 46 is deposited at the opening portion so that the depth (E) of the recess portion 31 does not increase so much.

Described specifically, when deposition of the TaN film 46 and sputter etching are conducted simultaneously, the deposition amount of the TaN film 46 relatively decreases in the small-diameter via hole 28a, while as the etching amount is almost equal between the TaN film 46 in the small-diameter via hole 28a and that in the large-diameter via hole 28c, the depth (D) of the recess portion 31 in the small-diameter via hole 28a relatively increases and the depth (D) of the recess portion 31 in the large-diameter via hole 28c relatively decreases. This is presumed to occur because the etching component (argon ion) and the film forming component (TaN film 46) differ in the distribution of an incident angle to the semiconductor substrate 1 and an amount of the etching component (argon ion) vertically incident to the semiconductor substrate 1 is greater so that the substantially same amount of the etching component is incident to the inside of the small-diameter via hole 28a and the inside of the large-diameter via hole 28c.

Although not illustrated, a Ta film which is an upper layer portion of the barrier metal film 32a is deposited by conventional sputtering, followed by deposition of a Cu film 32b on the Ta film.

Thus, according to the manufacturing method of the present embodiment, when the large-diameter via hole 28c and the small-diameter via holes 28a and 28b are formed simultaneously, the depth (E) of the recess portion 31 can be made greater in the small-diameter via hole 28w, while the depth (E) of the recess portion 31 in the large-diameter via hole 28c can be made smaller. This improves the filling of the Cu film 32b in the small-diameter via hole 28a and suppresses an increase or variation in resistance of the second-level wiring 32 in the large-diameter via hole 28c. In short, the manufacturing method of the present embodiment makes it possible to fully fill wiring materials (Cu film and barrier metal film) in two or more via holes formed in the same interlayer insulating film and different in diameter.

The invention made by the present inventors has been described specifically based on embodiments. It is needless to say that the invention is not limited to or by these embodiments but can be changed in various ways without departing from the gist of the invention.

For example, the manufacturing method of First Embodiment may be used in combination with the manufacturing method of Second Embodiment.

The invention can be applied to semiconductor devices whose multilayer Cu wiring is formed using the dual damascene process.

What is claimed is:

1. A method of manufacturing a semiconductor device comprising the steps of:
   (a) successively forming a first etching stopper film and a first interlayer insulating film over the main surface of a semiconductor substrate and forming a first metal hard mask layer containing a metal element over the first interlayer insulating film;
   (b) etching the first metal hard mask layer with a first photoresist film as a mask to form a plurality of first wiring trench patterns in the first metal hard mask layer;
   (c) after removal of the first photoresist film, forming a second photoresist film over the first metal hard mask layer having the first wiring trench patterns formed therein;
   (d) etching the first interlayer insulating film with the second photoresist film having a plurality of first via holes patterned therein and the first metal hard mask layer as a mask to form the first via holes in the first interlayer insulating film;
   (e) after removal of the second photoresist film, etching the first interlayer insulating film with the first metal hard mask layer as a mask to form, in the first interlayer insulating film, a plurality of first wiring trenches having a depth smaller than the thickness of the first interlayer insulating film;
   (f) during or after the step (e), removing the first etching stopper film exposed from the bottom surface of each of the first via holes;
   (g) after the step (f), successively depositing a first barrier metal film and a first metal film having Cu as a main component thereof over the first metal hard mask layer, in each of the first wiring trenches, and in each of the first via holes;
   (h) polishing and removing the first metal film, the first barrier metal film, and the first metal hard mask layer over the first interlayer insulating film by using chemical mechanical polishing to form a first-level wiring having the first metal film and the first barrier metal film in each of the first wiring trenches and each of the first via holes;
   (i) successively forming a second etching stopper film and a second interlayer insulating film over the first interlayer insulating film and the first-level wiring;
   (j) etching the second interlayer insulating film with a third photoresist mask having a plurality of second via holes patterned therein to form the second via holes in the second interlayer insulating film;
   (k) after removal of the third photoresist film, forming a fourth photoresist film over the second interlayer insulating film;
   (l) etching the second interlayer insulating film with the fourth photoresist film having a plurality of second wiring trenches patterned therein as a mask to form, in the second interlayer insulating film, the second wiring trenches having a depth smaller than the thickness of the second interlayer insulating film;
   (m) after removal of the fourth photoresist film, removing the second etching stopper film exposed from the bottom surface of each of the second via holes;
   (n) after the step (m), depositing a second barrier metal film having a metal nitride film over the second interlayer insulating film, and in each of the second wiring trenches, and in each of the second via holes;
   (o) removing the second barrier metal film on the bottom surface of each of the second via holes and exposing the first-level wiring from the bottom surface of each of the second via holes;
   (p) after the step (o), successively depositing a third barrier metal film having a metal film and a second metal film having Cu as a main component over the second interlayer insulating film, and in each of the second wiring trenches, and in each of the second via holes; and
   (q) polishing and removing the second metal film, the third barrier metal film, and the second barrier metal film over the second interlayer insulating film by using chemical mechanical polishing to form a second-level wiring including the second metal film and the third barrier metal film in each of the second wiring trenches and each of the second via holes,
   wherein in the step (f), by recessing the first interlayer insulating film at the opening portion of each of the first via holes, the diameter of the opening portion of each of the first via holes is made greater than the diameter of a region below the opening portion,
   wherein in the step (m), by recessing the second interlayer insulating film at the opening portion of each of the second via holes, the diameter of the opening portion of each of the second via holes is made greater than the diameter of a region below the opening portion, and
   wherein in the step (o), by sputter etching the second barrier metal film and the second interlayer insulating film at the opening portion of each of the second via holes, the diameter of the opening portion of each of the second via holes is made further greater than the diameter of a region below the opening portion.

2. The method of manufacturing a semiconductor device according to claim 1, wherein the first via holes include a via hole having a diameter equal to the minimum processing size of a circuit and a via hole having a diameter smaller than the minimum processing size of the circuit and the second via holes each has a diameter greater than the minimum processing size of a circuit.

3. The method of manufacturing a semiconductor device according to claim 1, wherein the dielectric constant of the first interlayer insulating film is smaller than the dielectric constant of the second interlayer insulating film.

4. The method of manufacturing a semiconductor device according to claim 1, wherein the elastic modulus of the first interlayer insulating film is smaller than the elastic modulus of the second interlayer insulating film.

5. The method of manufacturing a semiconductor device according to claim 1, wherein the second barrier metal film includes a TaN film, a TiN film or a WN film and the third barrier metal film includes a Ta film, a Ti film, or a W film.

\* \* \* \* \*